(12) United States Patent
Kobayashi et al.

(10) Patent No.: US 7,853,909 B2
(45) Date of Patent: Dec. 14, 2010

(54) ESD ANALYSIS DEVICE AND ESD ANALYSIS PROGRAM USED FOR DESIGNING SEMICONDUCTOR DEVICE AND METHOD OF DESIGNING SEMICONDUCTOR DEVICE

(75) Inventors: Susumu Kobayashi, Kanagawa (JP); Morihisa Hirata, Kanagawa (JP); Mototsugu Okushima, Kanagawa (JP); Tomohiro Kitayama, Kanagawa (JP); Tetsuya Katou, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 541 days.

(21) Appl. No.: 11/905,703

(22) Filed: Oct. 3, 2007

(65) Prior Publication Data

US 2008/0104554 A1 May 1, 2008

(30) Foreign Application Priority Data

Oct. 26, 2006 (JP) .............................. 2006-290732

(51) Int. Cl.
*G06F 17/50* (2006.01)
(52) U.S. Cl. ............................................. 716/5; 703/14
(58) Field of Classification Search ...................... 716/5; 703/16
See application file for complete search history.

(56) References Cited

U.S. PATENT DOCUMENTS

| | | | | |
|---|---|---|---|---|
| 6,445,039 | B1 * | 9/2002 | Woo et al. | 257/355 |
| 6,770,938 | B1 * | 8/2004 | Fliesler et al. | 257/357 |
| 6,963,110 | B2 * | 11/2005 | Woo et al. | 257/355 |
| 7,719,083 | B2 * | 5/2010 | Chang | 257/531 |
| 2008/0036037 | A1 * | 2/2008 | Woo et al. | 257/546 |
| 2008/0036536 | A1 * | 2/2008 | Khorramabadi | 330/252 |
| 2008/0174925 | A1 * | 7/2008 | Woo et al. | 361/56 |
| 2010/0172060 | A1 * | 7/2010 | Woo et al. | 361/56 |

FOREIGN PATENT DOCUMENTS

| | | |
|---|---|---|
| JP | 2004-282058 A | 10/2004 |
| JP | 2005-196468 A | 7/2005 |

OTHER PUBLICATIONS

Beebe, "Methodology for Layout Design and Optimization of ESD Protection Transistors", Proceedings of Electrical Overstress/Electrostatic Discharge Symposium, Sep. 10-12, 1996, pp. 265-275.*
Mohan et al., "Modeling ESD Protection", IEEE Potentials, vol. 24, No. 1, Feb.-Mar. 2005, pp. 21-24.*
Ziman et al., "Simulation and Measurement of EM Fields Caused by Electrostatic Discharges", IEE Colloquium on ESD (Electrostatic Charge) and ESD Counter Measures, Mar. 28, 1995, pp. 5/1-5/6.*

* cited by examiner

*Primary Examiner*—Phallaka Kik
(74) *Attorney, Agent, or Firm*—Foley & Lardner LLP

(57) ABSTRACT

An ESD (Electrostatic Discharge) analysis device includes: a circuit simulation unit; a border cell extraction unit; and a check unit. The circuit simulation unit executes a circuit simulation of design data of a semiconductor integrated circuit including a plurality of circuits of a plurality of power supply systems, to calculate potentials in a plurality of current paths between pads of different two of the plurality of power supply systems, when one of an ESD current and an ESD voltage is applied between the pads. The border cell extraction unit extracts border cells from circuits of the different two of the plurality of power supply systems, wherein the circuits are included in the plurality of circuits, the border cells input and/or output signals between the circuits. The check unit checks an ESD tolerance by calculating a potential difference between the border cells, based on the calculated potentials, the extracted border cells.

20 Claims, 16 Drawing Sheets

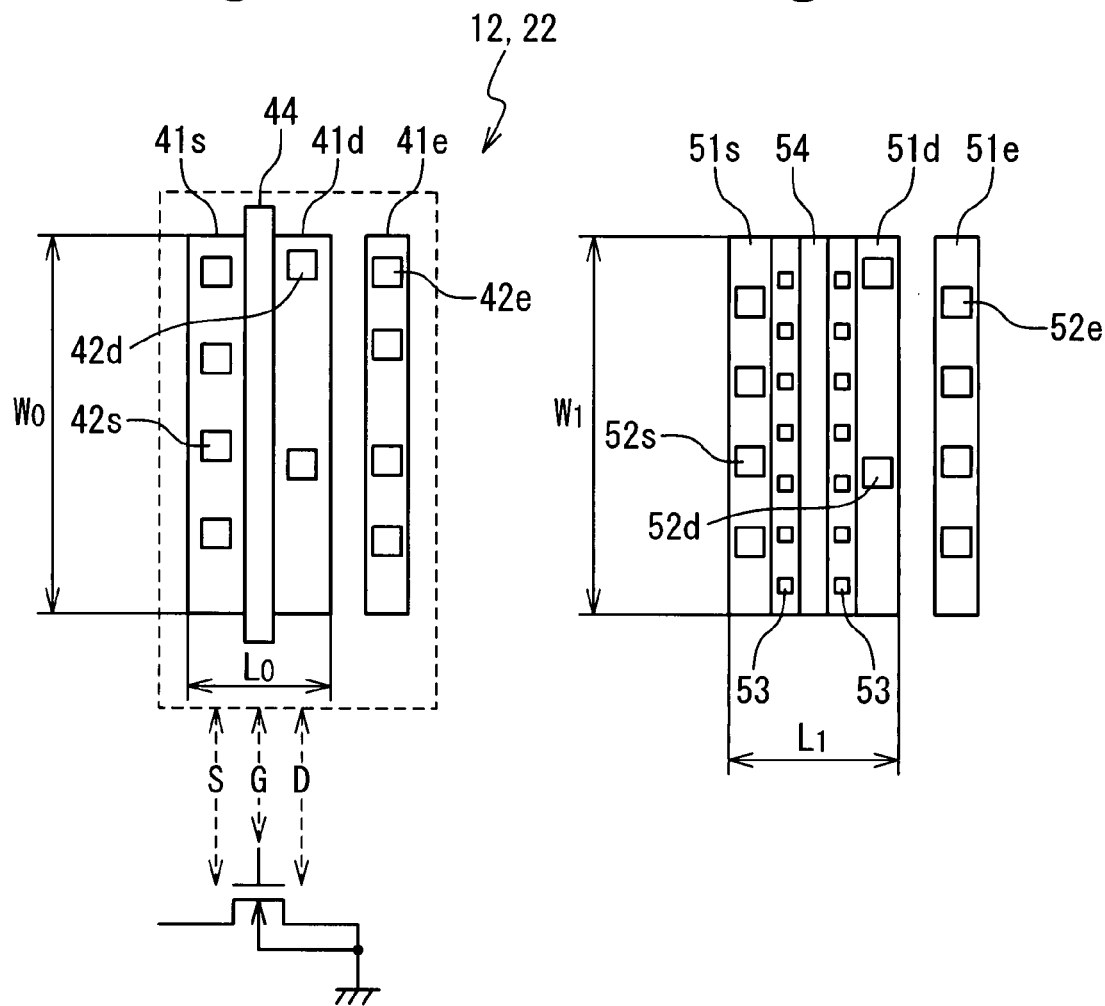

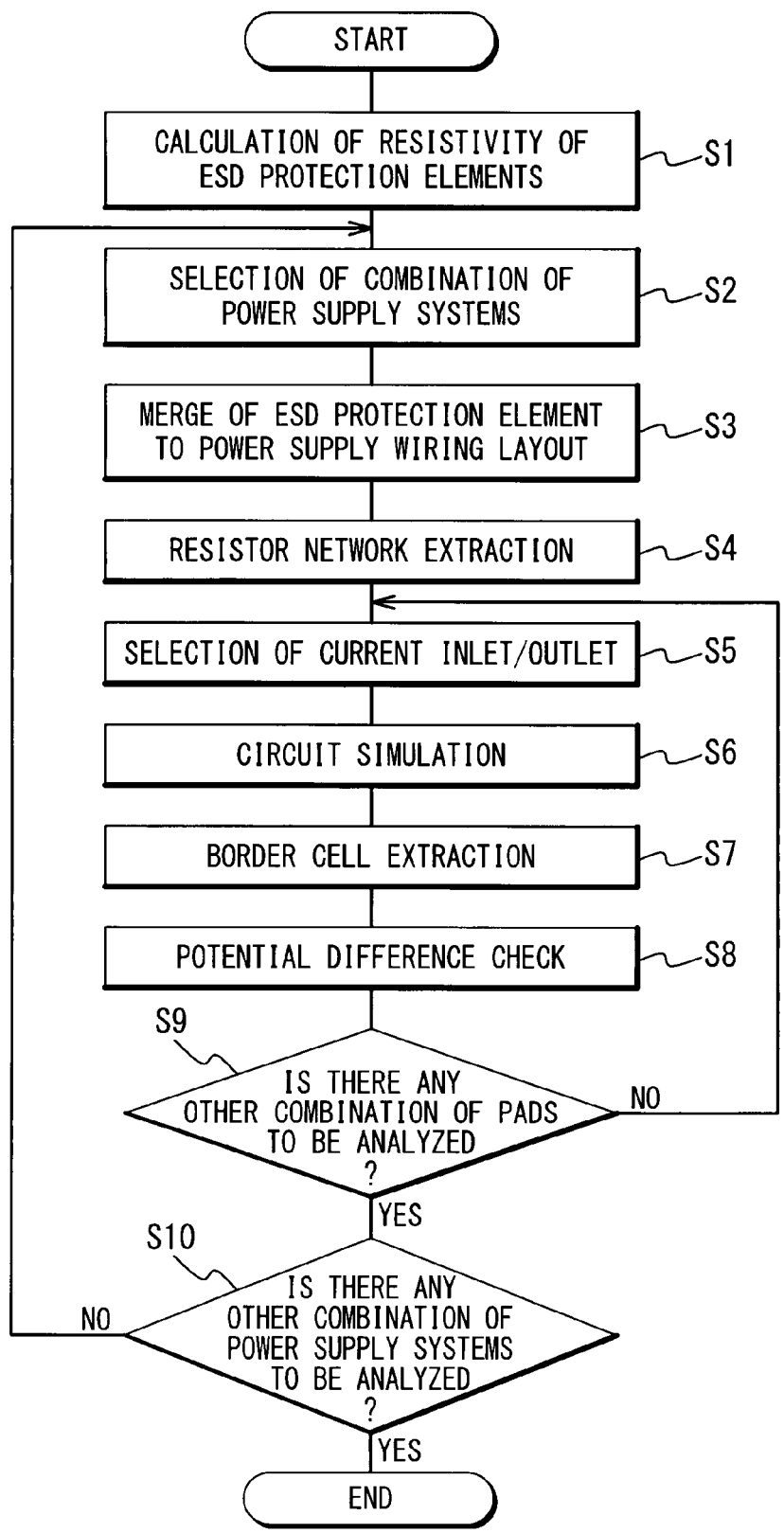

US 7,853,909 B2

ESD ANALYSIS DEVICE AND ESD ANALYSIS PROGRAM USED FOR DESIGNING SEMICONDUCTOR DEVICE AND METHOD OF DESIGNING SEMICONDUCTOR DEVICE

BACKGROUND OF THE INVENTION

1. Field of the Invention

The present invention relates to an ESD (Electrostatic Discharge) analysis device and an ESD analysis program which are used for designing a semiconductor device, and a method of designing a semiconductor device.

2. Description of Related Art

It is known that ESD (Electrostatic Discharge) analysis is carried out in designing a semiconductor device. For example, Japanese Laid-Open Patent Application JP-P 2005-196468 A (corresponding to US2005146380 A1) discloses an apparatus and a program for analysis of electrostatic discharge of a semiconductor integrated circuit. The apparatus for the analysis of the electrostatic discharge of the semiconductor integrated circuit has a resistor network generation portion, a protection circuit generation portion and an analysis portion. The resistor network generation portion generates a resistor network as a circuit equivalent to power supply wirings based on wiring pitches, wiring widths and sheet resistances of the power supply wirings in a logic cell area of the semiconductor integrated circuit. The protection circuit generation portion generates an electrostatic discharge protection network in which protection elements and pads placed in I/O cell areas of the semiconductor integrated circuit are connected to the resistor network. The analysis portion calculates voltages between the pads when currents equivalent to electrostatic discharges flow between the pads.

An ESD analysis flow according to this related art is as follows. First, modeling of the power supply wiring of LSI is executed with resistors to generate a grid-like power supply model (resistor network). Next, an I/O cell model including ESD protection elements and pads is connected to the power supply model to generate an ESD protection circuit model (electrostatic discharge protection circuit network). A shortest path between two pads in the ESD protection circuit model is searched and potential difference between the pads is calculated.

In recent years, power saving has been getting much important in the LSI. For this reason, for example, a technique that an unused circuit region is put into an OFF state or a technique that supplied voltages is decreased are adopted to a semiconductor chip. In these cases, a circuit in the semiconductor chip is divided into a plurality of circuit regions. Each circuit region belongs to one of a plurality of power supply systems. Each power supply system is controlled independently. Such semiconductor chip has a problem that cells (border cells) inputting and outputting signals to and from one circuit region in one power supply system to another circuit region in another power supply system are easy to be influenced by ESD. For example, when one CMOS inverter is used as a border cell in one power supply system at an output side and another CMOS inverter is used as a border cell in another power supply system at an input side, a through current can pass from the CMOS inverter at the output side to the CMOS inverter at the input side associated with application of ESD. In this case, a gate oxide film of the CMOS inverter at the input side may cause dielectric breakdown. Thus, there is a demand for the technique capable of appropriately analyzing influence of ESD on the border cells.

As for another related art, Japanese Laid-Open Patent Application JP-P 2004-282058 A (corresponding to US2006103421 A1) discloses a semiconductor integrated circuit device and a method of designing the same. The semiconductor integrated circuit device includes a first power supply wiring, a second power supply wiring, a first circuit portion power-supplied between the first and second power supply wirings, a third power supply wiring, a fourth power supply wiring, a second circuit portion power-supplied between the third and fourth power supply wirings, a first interface circuit formed in the first circuit, and a second interface circuit formed in the second circuit for inputting and outputting signals from and to the first interface circuit. The second power supply wiring is connected to the fourth power supply wiring. The second interface circuit is placed in the vicinity of the first interface circuit.

We have now discovered following facts. According to the ESD analysis disclosed in Japanese Laid-Open Patent Application JP-P 2005-196468 A, in a case of a single power source, the ESD protection circuit should be designed so that voltage applied to the power supply protection elements may be a predetermined voltage or smaller at the time of application of ESD. In this case, since voltage which is equal to or larger than the voltage applied to the power supply protection elements is not applied to cells, no problem occurs. However, when the ESD analysis of this related art is applied to a semiconductor device having a plurality of power supply systems, the following problems may occur.

FIG. 1 is a circuit model diagram for describing problems caused when the ESD analysis of the related art is applied to a semiconductor device having a plurality of power supply systems. The semiconductor device 101 includes a core region 105 and an I/O region 104 surrounding the core region 105. Each of the I/O region 104 and the core region 105 is divided into a circuit region 102 of a first power supply system (VDD1) and a circuit region 103 of a second power supply system (VDD2). The circuit region 102 belongs to the first power supply system and a first power source applies a voltage VDD1 to the circuit region 102. The circuit region 103 belongs to the second power supply system and a second power source applies a voltage VDD2 to the circuit region 103. The I/O region 104 of the circuit region 102 includes a plurality of pads 111 (including a pad 111A) and a plurality of ESD protection elements 112 (including pads 112-1, 112-2). The I/O region 104 of the circuit region 103 includes a plurality of pads 121 (including a pad 121B) and a plurality of ESD protection elements 122 (including pad 122-1, 122-2). The core region 105 in the circuit region 102 is connected to the core region 105 in the circuit region 103 with border cells 131 so as to be able to transmit data to each other. For example, one of the border cells 131 (border cells 131out) belongs to the circuit region 102 and the other of the border cells 131 (border cells 131in) belongs to the circuit region 103.

When ESD is applied between the circuit region 102 and the circuit region 103 of different power supply systems as shown in FIG. 1, a potential difference between the sums of voltages applied to two power supply protection elements may occur between border cells 131. In FIG. 1, consider that ESD is applied between the pad 111A as an ESD current inlet and the pad 121B as an ESD current outlet. The circuit region 102 of the first power supply system (VDD1) includes ESD protection elements 112-1, 112-2 and the circuit region 103 of the second power supply system (VDD2) includes ESD protection elements 122-1, 122-2. Thus, there are four routes possible to pass current. The first one is a route from the pad 111A through the ESD protection element 112-1 and then the ESD protection element 122-1 to the pad 121B. The second one is a route from the pad 111A through the ESD protection element 112-2 and then the ESD protection element 122-1 to the pad 121B. The third one is a route from the pad 111A through the ESD protection element 112-1 and then the ESD protection element 122-2 to the pad 121B. The final one is a route from the pad 111A through the ESD protection element 112-2 and then the ESD protection element 122-2 to the pad 121B. Thus, a potential difference occurs between a terminal of the ESD protection element 112-1 in the first power supply system (VDD1) side and a terminal of the ESD protection element 112-2 in the VDD1 power supply systems. As a result, currents also pass through wirings between the ESD protection element 112-1 and the ESD protection element 112-2 in the circuit region 102, thereby generating a potential difference. Consequently, the potential of the terminals of the border cell 131out in the first power supply system side is determined depending on a wiring resistance between the ESD protection element 112-1 and the border cell 131out and a wiring resistance between the ESD protection element 112-2 and the border cell 131out. That is, the potential cannot be obtained unless a circuit simulation is performed in consideration of wiring resistance between the ESD protection element 112-1 and the border cell 131out and wiring resistance between the ESD protection element 112-2 and the border cell 131out. This also applies to a potential of terminals of the border cell 131in in the second power supply system (VDD2) side. In other words, if the ESD analysis of the related art is applied to the semiconductor device including a plurality of power supply systems, a suitable ESD analysis cannot be achieved.

Furthermore, when the ESD analysis disclosed in Japanese Laid-Open Patent Application JP-P 2005-196468 A is applied to the semiconductor device having a plurality of power supply systems, the following problems may occur. First, in the border cells transferring signals between different power supply systems, a potential difference which determines whether or not gate breakdown (dielectric breakdown of gate oxide film) occurs cannot be explicitly analyzed. This is due to that, since information on the border cells across different power supply systems and their potential of the border cells is not outputted, the potential difference between border cells cannot be outputted.

Second, in the ESD analysis of the related art, only information on a shortest path among pads is outputted, and even if there is a border cell which possibly causes gate breakdown in the other paths, the border cell cannot be found. This is due to that, since an ESD check is performed by searching the shortest path between two pads, a dangerous point for the ESD in paths other than the shortest path cannot be considered.

Third, since a reference with respect to a potential difference between pads needs to be set, limitation may become stricter than necessary and flexibility in design may be lowered. This is due to that, in spite that the potential difference between the border cells determines whether or not gate breakdown occurs actually, the reference is set based on a potential difference between pads in a shortest path.

In designing a semiconductor device having a plurality of power supply systems, there is a demand for a technique capable of carrying out an ESD analysis more accurately. In designing a semiconductor device having a plurality of power supply systems, there is a demand for a technique capable of relaxing ESD standards and improving flexibility in design of the semiconductor device.

SUMMARY

The present invention seeks to solve one or more of the above problems, or to improve upon those problems at least in part. In one embodiment, an ESD (Electrostatic Discharge) analysis device includes: a circuit simulation unit configured to execute a circuit simulation of design data of a semiconductor integrated circuit including a plurality of circuits of a plurality of power supply systems, to calculate potentials in a plurality of current paths between pads of different two of the plurality of power supply systems, when one of an ESD current and an ESD voltage is applied between the pads; a border cell extraction unit configured to extract border cells from circuits of the different two of the plurality of power supply systems, wherein the circuits are included in the plurality of circuits, the border cells input and/or output signals between the circuits; and a check unit configured to check an ESD tolerance by calculating a potential difference between the border cells, based on the calculated potentials, the extracted border cells.

According to the present invention, potentials to which the border cells belonging to different power supply systems are applied are calculated, and the ESD tolerance is evaluated and checked using potential differences based on the calculated potentials. That is, since the ESD analysis can be executed based on the potential differences directly relating to gate breakdown, the accuracy of the ESD analysis can be improved. In addition, since it is not necessary for the ESD standards to set an extra margin, it is possible to relax ESD standards and thus, improve the flexibility in design.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 8A to 8C are schematic views for describing a method of converting ESD protection elements into resistance elements;

FIG. 9 is a flow chart showing steps performed by an ESD analysis program according to the present invention;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, embodiments of an ESD analysis device and an ESD analysis program used for a method of designing semiconductor device, and a method of designing a semiconductor device according to the present invention will be described with reference to attached drawings.

Figure 1:
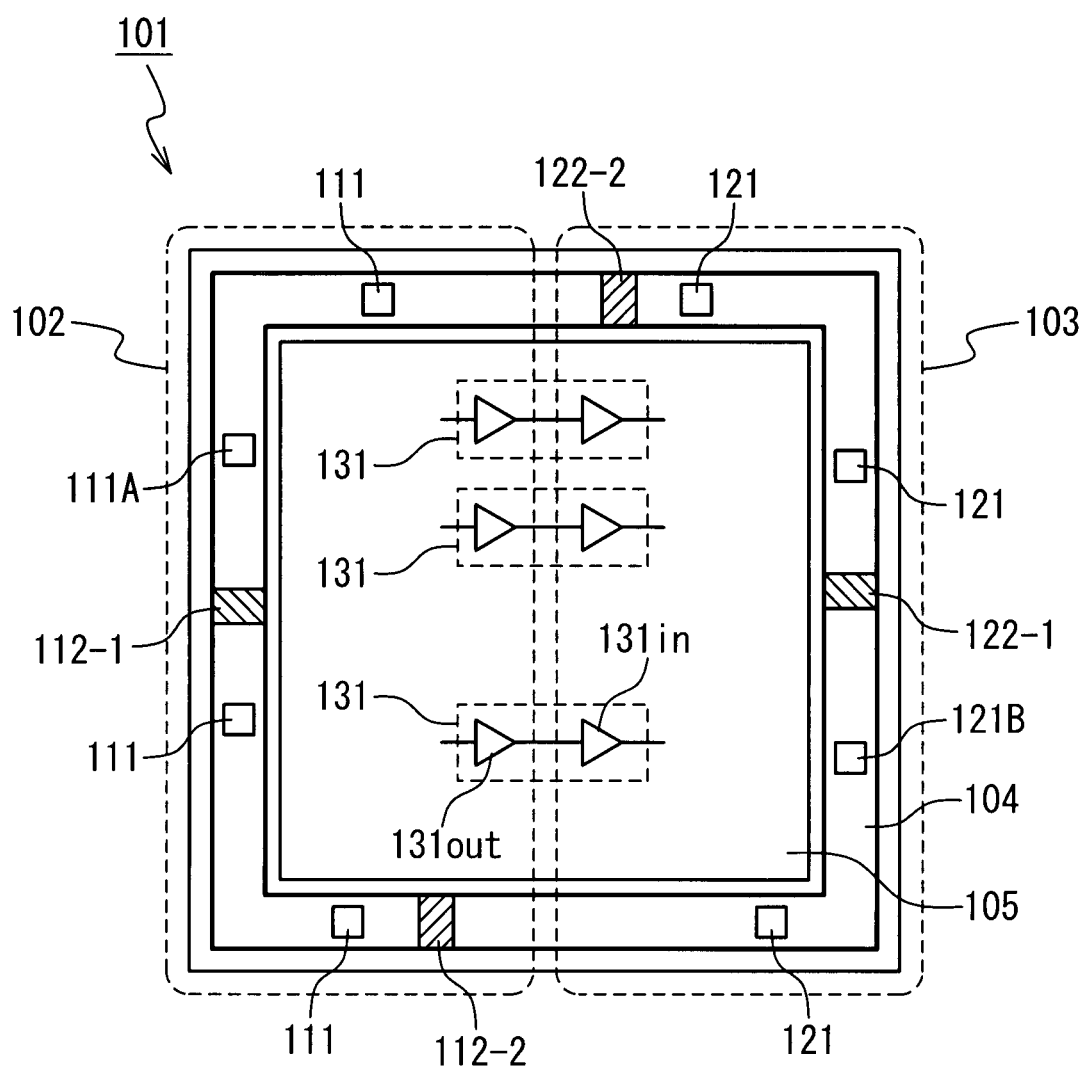
FIG. 1 is a circuit model diagram for describing problems caused when ESD analysis according to the related art is applied to a semiconductor device having a plurality of power supply systems.
Figure 2:
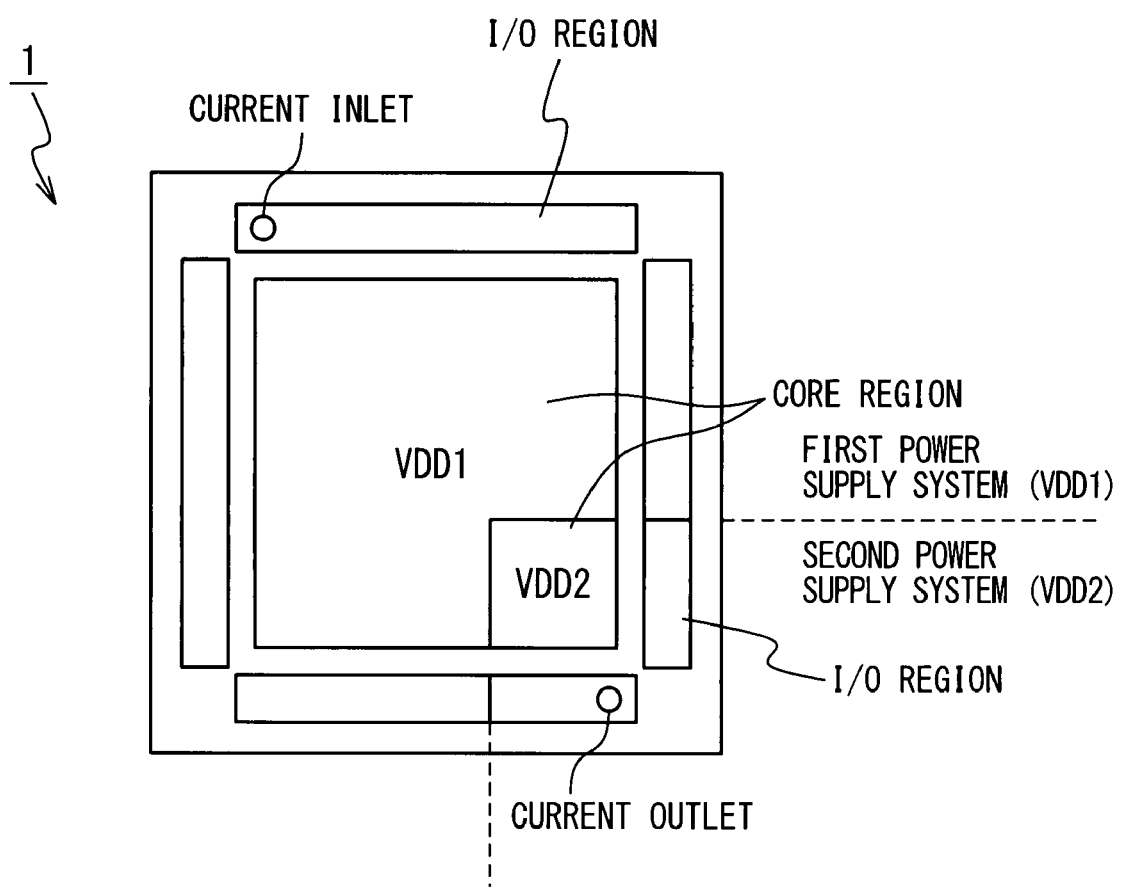
FIG. 2 is a schematic view showing a semiconductor device having a plurality of power supply systems, to which the present invention is applied.

FIG. 2 is a schematic view showing a semiconductor device having a plurality of power supply systems, to which the present invention is applied. The semiconductor device includes a core region and an I/O region surrounding the core region. The I/O region and the core region are each divided into a circuit region operating by a first power supply system (VDD1) and a circuit region operating by a second power supply system (VDD2). The I/O region has a plurality of pads (not shown) and a plurality of ESD protection elements (not shown). An ESD current, for example, passes through a path from a pad in the I/O region of the first power supply system as an inlet to a pad in the I/O region of the second power supply system as an outlet. For each combination of power supply systems, current flow and potential of each node for each combination of pads are determined and used for ESD analysis. Details of the ESD analysis will be described later.

Figure 3:
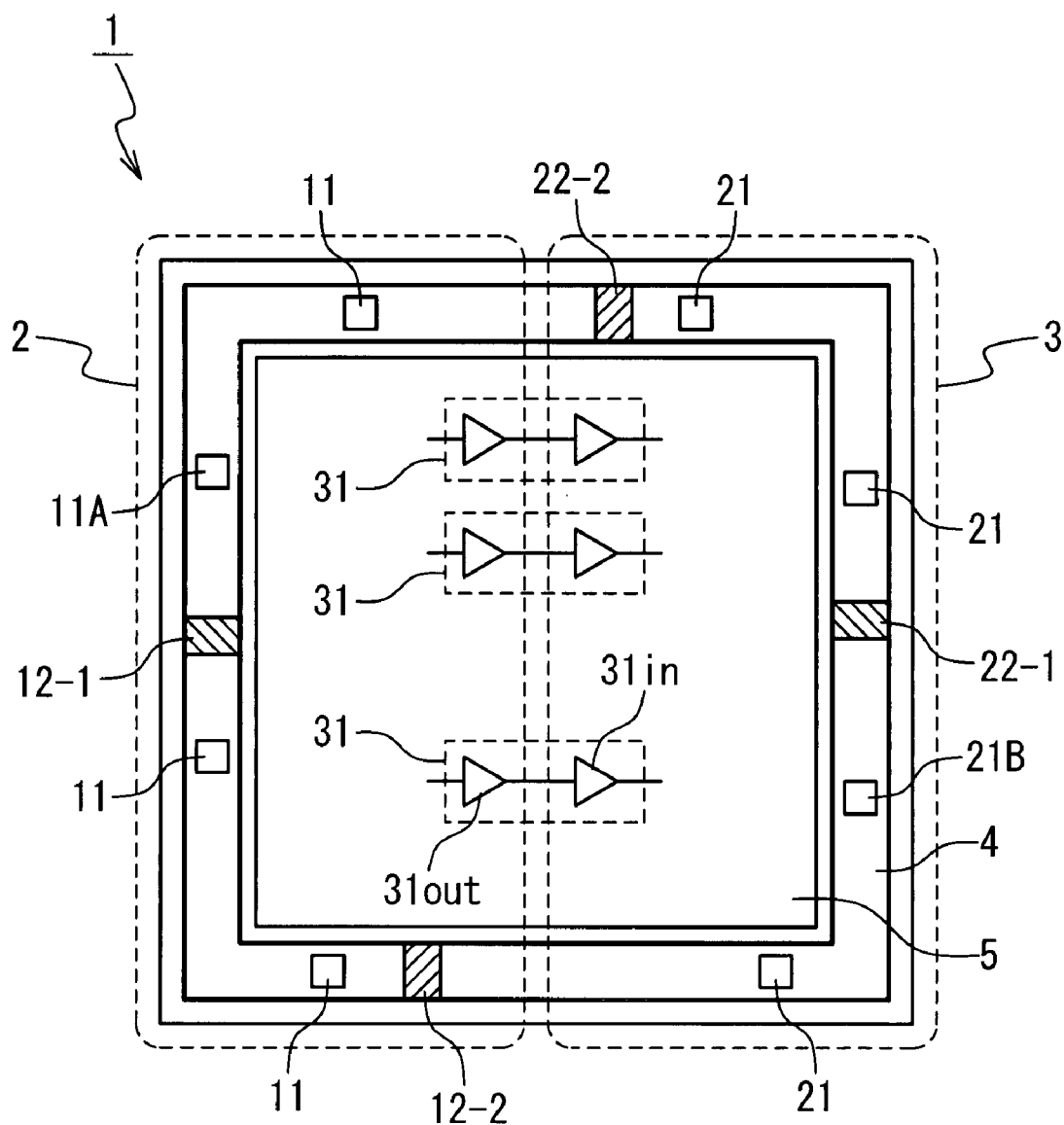
FIG. 3 is a circuit model diagram in which a modeling is executed on the semiconductor device shown in FIG. 2.

FIG. 3 is a circuit model diagram in which a modeling is executed on the semiconductor device shown in FIG. 2. The semiconductor device 1 includes a core region 5 and an I/O region 4 surrounding the core region 5. Each of the I/O region 4 and the core region 5 is divided into a circuit region 2 of the first power supply system (VDD1) and a circuit region 3 of the second power supply system (VDD2). The circuit region 2 belongs to the first power supply system and a first power source applies a voltage VDD1 to the circuit region 2. The circuit region 3 belongs to the second power supply system and a second power source applies a voltage VDD2 to the circuit region 3. The I/O region 4 in the circuit region 2 includes a plurality of pads 11 (including a pad 11A) and a plurality of ESD protection elements 12 (including pads 12-1, 12-2). The I/O region 4 in the circuit region 3 includes a plurality of pads 21 (including a pad 21B) and a plurality of ESD protection elements 22 (including a pad 22-1, 22-2). The core region 5 in the circuit region 2 is connected to the core region 5 in the circuit region 3 with border cells 31 so as to be capable to transmit data to each other. For example, one of the border cells 31 (the border cell 31out) belongs to the circuit region 2 and another of the border cells 31 (the border cell 31in) belongs to the circuit region 3.

Figure 4:
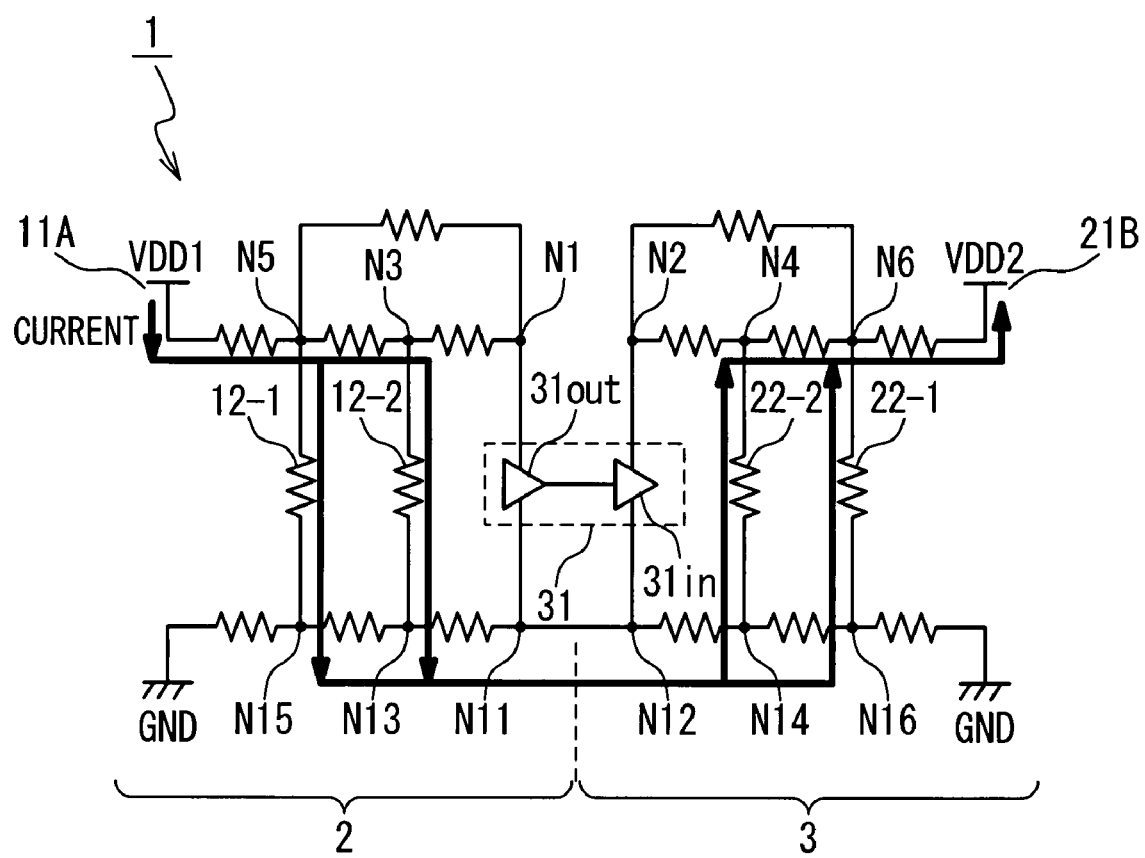
FIG. 4 is a schematic circuit diagram showing an example in which the semiconductor device shown in FIG. 3 is represented in the form of a resistor network.

FIG. 4 is a schematic circuit diagram showing an example in which the semiconductor device shown in FIG. 3 is represented in the form of a resistor network. Same reference letters are given to the same elements as those in FIG. 3. The "N" means a node in the resistor network. That is, N1 to N6 and N11 to N16 are nodes in the resistor network.

For example, the pad 11A among the plurality of pads 11 is used as an inlet for a current and the pad 21B among the plurality of pads 21 is used as an outlet for the current. Paths for the current passing when ESD is applied are shown as a resistor network including the ESD protection elements 12-1, 12-2, 22-1, 22-2. In the example shown in FIG. 4, potentials of the border cells 31out, 31in are determined at nodes N1, N2, respectively.

In the example shown in FIG. 4, a GND wiring is common to the circuit region 2 of the first power supply system (VDD1) and the circuit region 3 of the second power supply system (VDD2). However, the present invention is not limited to this example.

Figure 5:
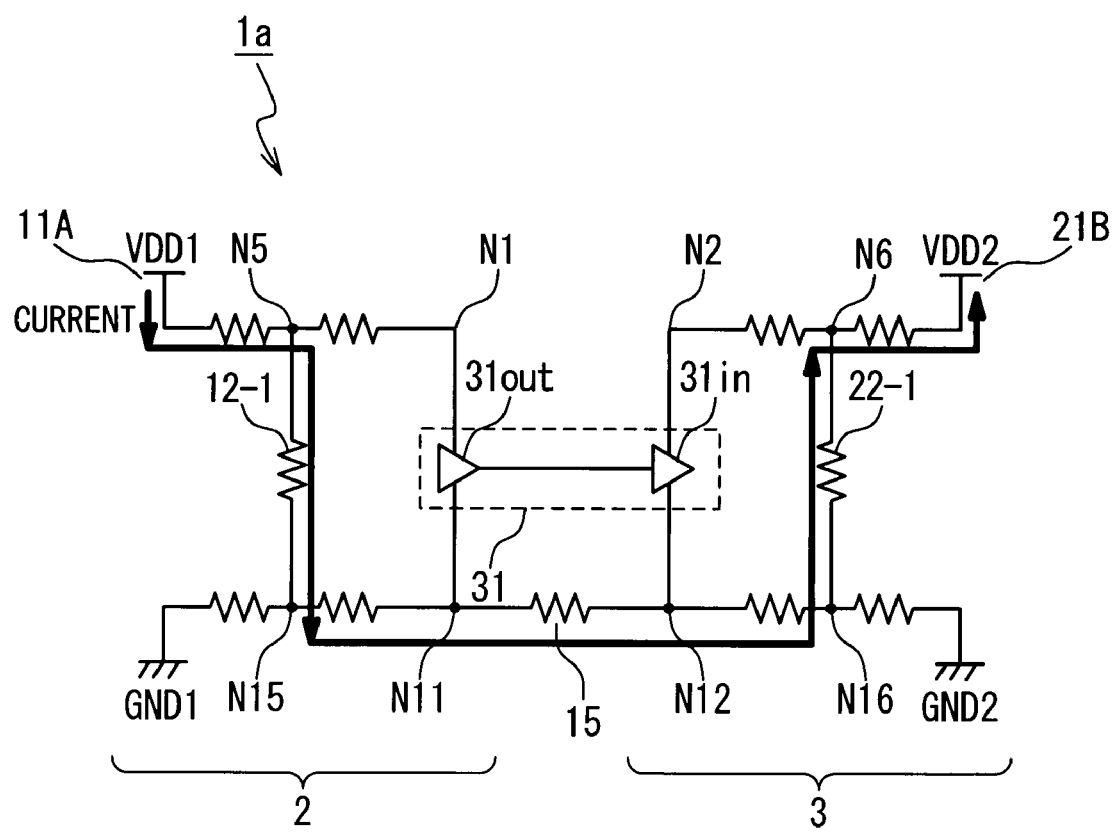
FIG. 5 is a schematic circuit diagram showing another example in which the semiconductor device is represented in the form of another resistor network.

For example, FIG. 5 is a schematic circuit diagram showing another example in which the semiconductor device is represented in the form of another resistor network. In a semiconductor device 1a, contrary to the example in FIG. 4, a GND power source is separated to a GND power source 1 (GND 1) and a GND power source 2 (GND 2), each of which relates to one of the plurality of power supply systems. Further, a protection element (a GND-to-GND protection element 15) is added between these separated GND power sources 1, 2. That is, the GND-to-GND protection element 15 is placed between a node N11 and a node N12. Same reference letters are given to the same elements as those in FIG. 4. Also, as shown in FIG. 4, the present invention can be applied to this example.

Figure 6:
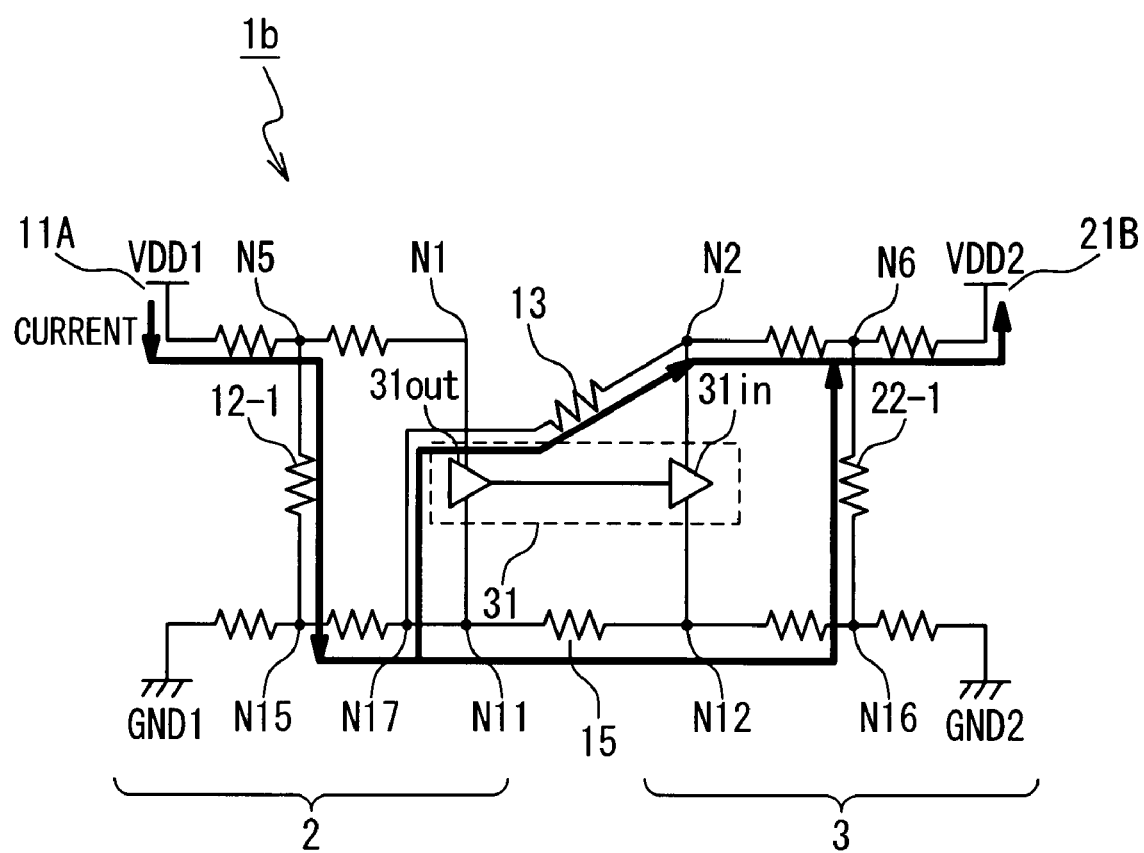
FIG. 6 is a schematic circuit diagram showing another example in which the semiconductor device is represented in the form of another resistor network.

For example, FIG. 6 is a schematic circuit diagram showing another example in which the semiconductor device is represented in the form of another resistor network. In a semiconductor device 1b, contrary to the example in FIG. 5, a protection element (an ESD protection element 13) is added between the GND power source and the second power source (VDD2) of different power supply systems. That is, the ESD protection element 13 is placed between a node N17 (N11) and a node N2. Same reference letters are given to the same elements as those in FIG. 5. Also, as shown in FIG. 4, the present invention can be applied to this example.

Figure 7:
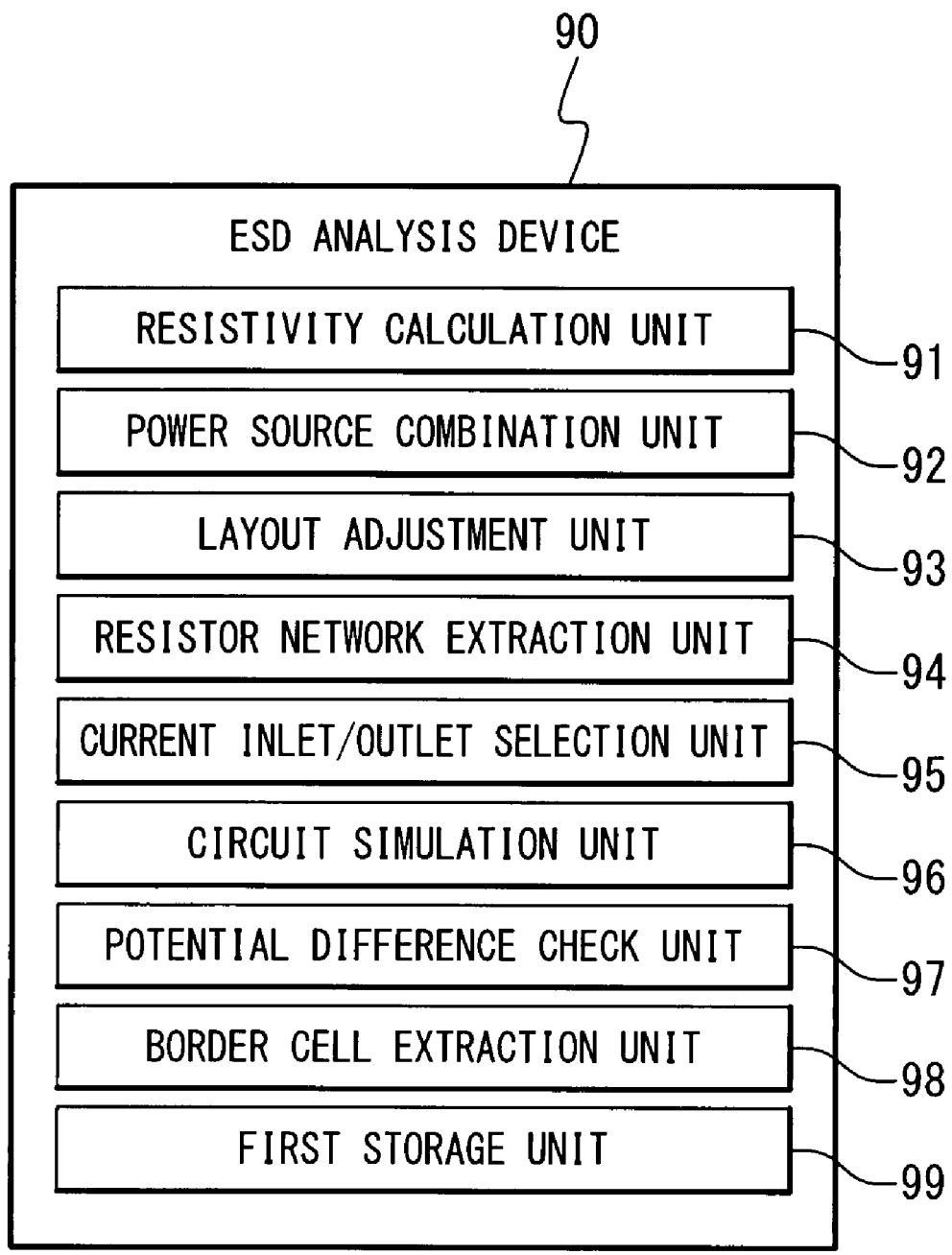
FIG. 7 is a block diagram showing a configuration of an embodiment of an ESD analysis device according to the present invention.

Next, an embodiment of the ESD analysis device according to the present invention will be described. FIG. 7 is a block diagram showing a configuration of the embodiment of the ESD analysis device according to the present invention. The ESD analysis device 90 is an information processing device embodied by a personal computer, a work station or the like. The ESD analysis device 90 generates the resistor networks (FIGS. 4 to 6) equivalent to the circuit model based on the circuit model (FIG. 3) obtained by modeling of the semiconductor device (FIG. 2). Then, the ESD analysis device 90 calculates a potential at each node of the resistor network and a potential difference between border cells of different power supply systems based on the resistor networks. Whereby, an ESD tolerance of each border cell is assessed.

The ESD analysis device 90 includes a resistivity calculation unit 91, a power source combination unit 92, a layout adjustment unit 93, a resistor network extraction unit 94, a current inlet/outlet selection unit 95, a circuit simulation unit 96, a potential difference check unit 97, and a border cell extraction unit 98 as computer programs, and a first storage unit 99 as data and a computer program. The resistivity calculation unit 91, the power source combination unit 92, the layout adjustment unit 93, the resistor network extraction unit 94, the current inlet/outlet selection unit 95, the circuit simulation unit 96, the potential difference check unit 97 and the border cell extraction unit 98 are stored in a memory device (for example, an HDD (a Hard Disc Drive)) mounted in the information processing device, loaded in a main memory and operated by a CPU (a Central Processing Unit). The first storage unit 99 is stored in the memory device (for example, the HDD) mounted in the information processing device. The first storage unit 99 is accessed by the CPU or the like for a reading and writing operations at the time of operations of the resistivity calculation unit 91, the power source combination unit 92, the layout adjustment unit 93, the resistor network extraction unit 94, the current inlet/outlet selection unit 95, the circuit simulation unit 96, the potential difference check unit 97 and the border cell extraction unit 98.

The resistivity calculation unit 91 calculates resistivity of the ESD protection elements 12, 22. That is, electrical characteristics of the ESD protection elements 12, 22 are measured using TEG (Test Element Group). Based on the measured values, a modeling of the ESD protection elements 12, 22 are executed to obtain resistors as the ESD protection element model, and the resistivity (or sheet resistance) of the resistors is calculated.

FIGS. 8A to 8C are schematic views for describing a method of converting the ESD protection elements into resistance elements. FIG. 8A is a plane view showing an MOS transistor as an example of the ESD protection elements 12, 22. Each of the ESD protection elements 12, 22 has a diffusion layer 41s as a source and contacts 42s thereof, a gate 44, a diffusion layer 41d as a drain and contacts 42d thereof. The diffusion layer 41d is grounded via the contacts 42d, a wiring (not shown), contacts 42e and a diffusion layer 41e (connected to GND wiring).

FIGS. 8B and 8C show layout data in the case where the protection elements in FIG. 8A are converted into the resistance elements. FIG. 8B is a plan view and FIG. 8C is a sectional view. A layer 55 indicates a wiring. The layer 55 corresponds to a wiring which is not shown in FIG. 8A. A layer 52 indicates a contact. That is, a layer 52s corresponds to the contact 42s, a layer 52d corresponds to the contact 42d, and a layer 52e corresponds to the contact 42e. A layer 51 indicates a diffusion layer. That is, a layer 51s corresponds to the diffusion layer 41s, a layer 51d corresponds to the diffusion layer 41d, and a layer 51e corresponds to the diffusion layer 41e. The diffusion layer is a same layer irrespective of the type of devices and has zero (0) ohm. A layer 54 corresponds to the gate 44 of the MOS transistor (FIG. 8A). That is, the layer 54 indicates the resistance element having electrical characteristics similar to $I_{DS}$-$V_{GS}$ properties of the MOS transistor. The resistance element is provided on a layer which varies according to a type of device. In the case that the resistance element is converted from the MOS transistor, the layer is the layer 54. The layer 53 indicates a dummy contact of zero (0) ohm which is virtually provided with an introduction of the layer 54.

In the case that the MOS transistor in the semiconductor device is converted into the resistance element, the electrical characteristics are determined mainly depending on the size of the MOS transistor. Thus, by representing characteristics of the layer 54 as resistivity, preferably, in a case that another ESD protection element is converted into a resistance element, resistance of the other ESD protection element can be rapidly acquired from the resistivity and a size thereof.

In FIG. 7, the power source combination unit 92 selects one from a plurality of combinations of power supply systems. That is, one pair is selected from a plurality of pairs composed of any two of a plurality of power supply systems. However, for example, a pair of the first power supply system (VDD1) and the second power supply system (VDD2) and a pair of the second power supply system (VDD2) and the first power supply system (VDD1) are considered to be the same combination (pair). In a case of two power supply systems, there is only one combination as described above.

Although FIG. 2, FIG. 3, and FIGS. 4 to 6 show two power supply systems, the present invention is not limited to these examples. Even if there are power supply systems more than two, the present invention can be applied. For example, when there are three power supply systems, three combinations are possible which are the first power supply system and the second power supply system, the first power supply system and a third power supply system, and the second power supply system and the third power supply system.

The layout adjustment unit 93 merges the ESD protection elements 12, 22 to power supply wiring layout data. That is, the ESD protection elements 12, 22 (FIG. 8A) in the layout data (power supply wiring layout data) after layout of power supply wirings is finished are converted into the resistance elements (FIG. 8B, FIG. 8C) that are the ESD protection element models.

The resistor network extraction unit 94 extracts a resistor network. That is, the resistor network is extracted from the layout data created in the layout adjustment unit 93 by using a conventionally known RC extraction tool or the like. At this time, to the layout corresponding to the ESD protection elements 12, 22, the resistivity (or sheet resistance value) obtained by the resistivity calculation unit 91 is used. This creates the resistor network such as resistor networks shown in FIGS. 4 to 6.

The current inlet/outlet selection unit 95 selects an inlet and an outlet of a current. That is, in a circuit simulation, a pad to which the current is applied (current inlet) and a pad from which the current is drawn (current outlet) are selected. In the combinations of the power supply systems selected by the power source combination unit 92, a pad in one power supply system serves as the current inlet and a pad in the other power supply system serves as the current outlet. As a general rule, for each combination of pads in the combination of power supply systems selected by the power source combination unit 92, a circuit simulation is carried out by the circuit simulation unit 96.

The circuit simulation unit 96 performs the circuit simulation. That is, the resistor network extracted by the resistor network extraction unit 94 is set such that a constant current is applied to the current inlet and the current is drawn from the current outlet selected by the current inlet/outlet selection unit 95 to carry out the circuit simulation. A potential at each node at this time is observed and stored together with location information.

The border cell extraction unit 97 extracts border cells. That is, for the combination of the power supply systems selected by the power source combination unit 92, the border cells are extracted based on the design data. Here, the border cell 31 refers to a cell which transfers a signal between the circuit regions of different power supply systems (for example, the first power supply system and the second power supply system). The border cell 31 is composed of a pair of the border cell 31out for transmitting the signal and the border cell 31in for receiving the signal.

Here, a set of pairs of border cells for the combination of relevant power supply systems.

The potential difference check unit 98 checks the potential difference between border cells. That is, the potential of each pair of border cells 31 obtained by the border cell extraction unit 97 is calculated by referring to the potential obtained by the simulation executed by the circuit simulation unit 96.

It is determined which of nodes each border cell 31 corresponds to in the simulation based on layout design information and location information of the node.

The calculated potential difference of each pair of border cells 31 is compared with predetermined potential difference reference (an upper limit of the potential difference which does not cause gate breakdown) for check.

Next, referring to FIGS. 3 to 4, FIG. 7 and FIG. 9, steps performed by an ESD analysis program of the ESD analysis device according to the present invention will be described below. FIG. 9 is a flow chart showing the steps performed by the ESD analysis program according to the present invention.

(1) Step S1: Calculation of Resistivity of ESD Protection Elements

Electrical characteristics of the ESD protection elements 12, 22 are measured using TEG (for example, MOS transistor). Based on the measured electrical characteristics (for example, $I_{DS}$-$V_{GS}$ characteristics of the MOS transistor), the MOS transistor modeling is executed to obtain resistance elements having similar electrical characteristics as the model. The resistances of the resistance elements are normalized according to a size of the TEG to calculate a resistivity (or sheet resistance value). The resistance elements (FIG. 8B, FIG. 8C) and the resistivity (or sheet resistance value) of the model are associated with the ESD protection elements 12, 22 and stored in the first storage unit 99.

(2) Step S2: Selection of Combination of Power Supply Systems

Based on the power supply wiring layout data as the layout data after layout of the power supply wirings is finished, the power source combination unit 92 extracts a plurality of power supply systems. Then, the power source combination unit 92 selects one of combinations of any two power supply systems among the plurality of the power supply systems. In the example shown in FIG. 3, the circuit region 2 for the first power supply system and the circuit region 3 for the second power supply system are extracted and selected. The power supply wiring layout data is stored in the first storage unit 99.

(3) Step S3: Merge of ESD Protection Element to Power Supply Wiring Layout

Referring to the first storage unit 99, for the combination of the power supply systems selected at the above-mentioned step S2, the layout adjustment unit 93 converts the ESD protection elements 12, 22 (FIG. 8A) in the power supply wiring layout data into the resistance elements (FIG. 8B, FIG. 8C) of the model. After conversion, the power supply wiring layout data is stored in the first storage unit 99.

(4) Step S4: Resistor Network Extraction

The resistor network extraction unit 94 extracts the resistor network from the layout data created at the above-mentioned step S3 by using a conventionally known RC extraction tool or the like. At this time, for the layout (resistance elements) corresponding to ESD protection elements 12, 22, the resistivity (or sheet resistance value) obtained at the above-mentioned step S1 is used. When the resistivity is used, a resistance value is calculated by multiplying the size of the resistance element (L×W) by the resistivity. Through this processing, the resistor network such as the resistor network shown in FIG. 4 can be obtained. The resistor network is stored in the first storage unit 99.

(5) Step S5: Selection of Current Inlet/Outlet

In a circuit simulation, the current inlet/outlet selection unit 95 selects (specifies) a pad to which a current is applied (current inlet) and a pad from which a current is drawn (current outlet). Here, in the combination of the power supply systems selected at the above-mentioned step S2, a pad in one power supply system serves as the current inlet and a pad in the other power supply system serves as the current outlet. In the example shown in FIG. 4, the pad 11A in the circuit region 2 for the first power supply system is set as the current inlet and the pad 21B in the circuit region 3 for the second power supply system is set as the current outlet.

(6) Step S6: Circuit Simulation

The circuit simulation unit 96 performs a circuit simulation to the resistor network extracted at the above-mentioned step S4 such that a constant current is applied to the current inlet and the current is drawn from the current outlet selected at the above-mentioned step S5. At this time, a potential at each of nodes (for example, nodes N1 to N6, N11 to N16 in FIG. 4) is observed and measured, and the measured potential is associated with location information of each node. Then, these potential and location information are stored in the first storage unit 99.

(7) Step S7: Border Cell Extraction (Search)

For the combination of the power supply systems selected at the above-mentioned step S2, the border cell extraction unit 97 extracts the border cell 31 on the basis of the power supply wiring layout data and design data. For example, the border cell 31 is extracted as follows.

For example, the border cell is searched by equipotential traces. One of the equipotential traces is executed on a power supply wiring between each cell and the power source in a semiconductor device, starting from a pad for the power supply in the power supply wiring. The other equipotential trace is executed on input/output signals between the cells.

Alternatively, first, a labeling is performed on each instance (cell) in the layout design data to identify which of the power supply systems the instance belongs to by tracing the instance from a power supply net of DEF (Design Exchange Format). Next, as for each net in the layout design data, power supply systems for the instances connected to the net are checked, and it is examined whether or not the net spreads over a plurality of power supply systems. The border cell is found from the instances connected to the net which spreads over the plurality of power supply systems. In the example shown in FIG. 4, cells belonging to the circuit region 2 of the first power supply system and cells belonging to the circuit region 3 of the second power supply system are extracted. Then, cells, one of which belongs to the circuit region 3 and another of which belongs to the circuit region 3, connected to each other with a signal line is determined as the border cell 31 (a pair of the border cells 31out, 31in).

In this manner, for the combination of power supply systems selected at the above-mentioned step S2, each border cell 31 (a pair of the border cells 31out, 31in) is extracted. The extracted border cells 31 are stored in the first storage unit 99.

(8) Step S8: Potential Difference Check

The potential difference check unit 98 calculates a potential of each border cell 31 obtained at the above-mentioned step S7 referring to the potential obtained by the simulation at the above-mentioned step S6. For example, in a case shown in FIG. 4, a potential of the border cell 31out is a potential at the node N1 and a potential of the border cell 31in is a potential at the node N2. It is determined which node corresponds to each border cell 31in the circuit simulation based on the layout design information and the location information of the node.

For checking, a potential difference between the border cell 31out and the border cell 31in in each border cell 31 is compared with an upper limit of the predetermined potential difference reference (the potential difference which does not cause gate breakdown, which is stored in the first storage unit 99). Information (the location information, the potential difference information, etc.) of each border cell 31 and information on whether or not the potential difference exceeds the potential difference reference are stored in the first storage unit 99.

(9) Step S9: Execution for Each Combination of Pads

The above-mentioned steps S5 to S8 are executed for each combination of the pads in the combination of power supply systems selected at the above-mentioned step S2. At this time, even when directions of the current flow are opposite to each other, they are considered as different combinations and the above-mentioned steps are executed.

(10) Step S10: Execution for Each Combination of Power Supply Systems

The above-mentioned steps S2 to S9 are executed for each combination of the power supply systems extracted at the above-mentioned step S2.

As described above, the ESD analysis using the ESD analysis device can be carried out.

Figure 10A:
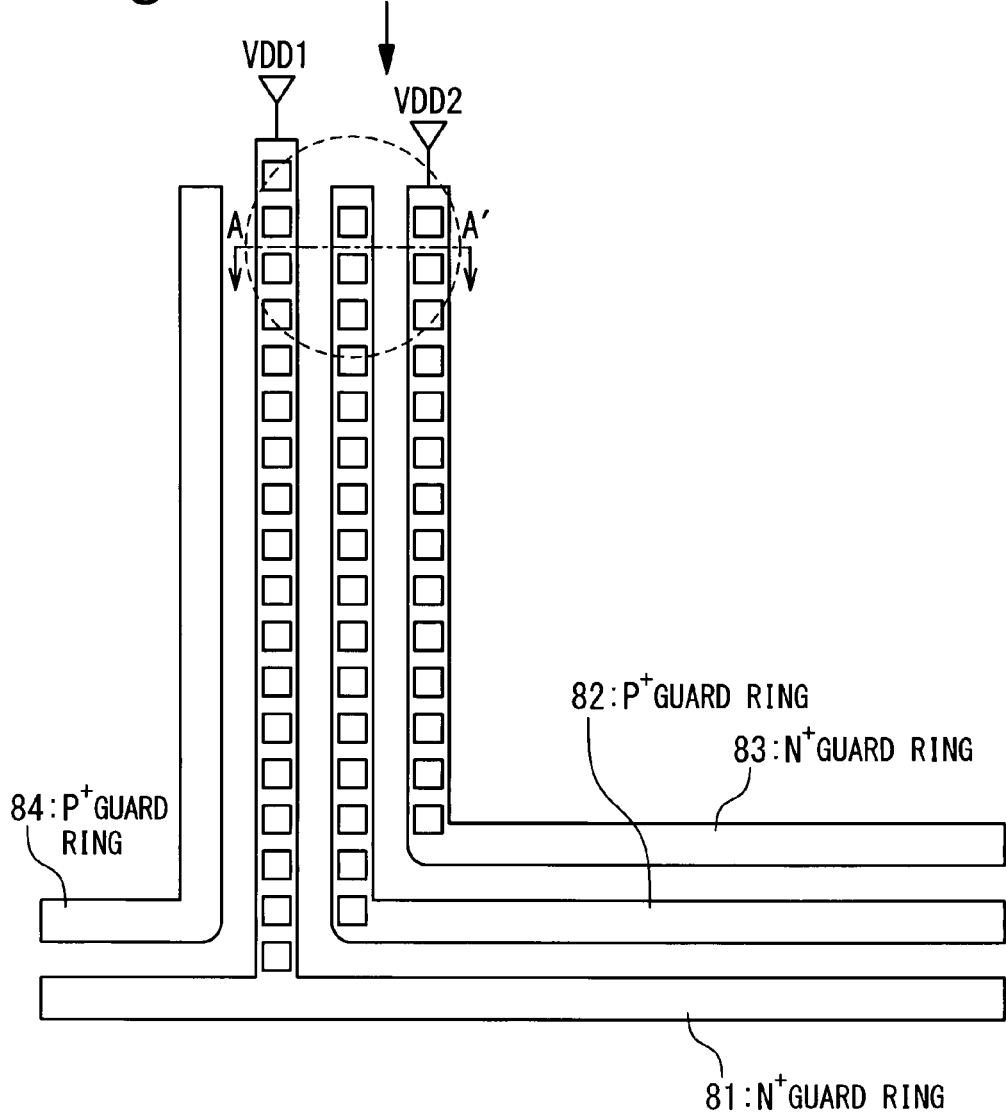
FIGS. 10A and 10B are a plan view and a sectional view, respectively, showing an example in which adjacent elements in the border between circuit regions for different power supply systems are destructed due to the potential difference between the adjacent elements.
Figure 10B:
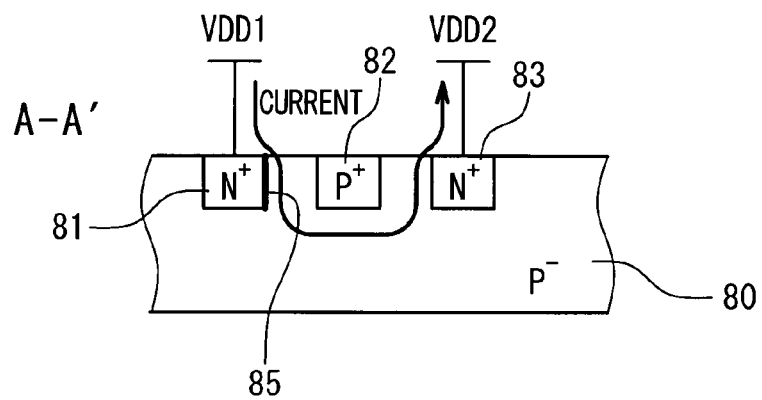

In the border between the circuit regions of the different power supply systems, in addition to the border cell itself, another adjacent element may be destructed due to a potential difference between these adjacent elements. For example, it is possible to check the potential difference between such elements at the step S8. FIGS. 10A and 10B are views showing an example in which the adjacent elements in the border between the circuit regions for the different power supply systems are destructed due to the potential difference between the adjacent elements. FIG. 10A is a plan view and FIG. 10B is a sectional view along the line A-A' shown in FIG. 10A. FIGS. 10A and 10B show N+ guard rings 81, 83 and P+ guard rings 82, 84 in the semiconductor device. Here, it is assumed that the border between the circuit regions of the different power supply systems is located at a position shown by an arrow in FIG. 10A. In this case, as shown in FIG. 10B, a current may pass from the first power source of VDD1 to the second power source of VDD2 through the N+ guard ring 81, a P-substrate (or a P-well) 80 and the N+ guard ring 83. Then, a border 85 between the N+ guard ring 81 and the P-substrate (or P-well) 80 may be destructed due to Joule heat. The fact whether or not the current passes can be predicted based on a potential difference between the N+ guard ring 81 and the N+ guard ring 83 and a distance between these rings. Since a potential of each guard ring is calculated in the circuit simulation at the step S6, the potential difference can be calculated. Furthermore, since a location of each guard ring is found based on the power supply wiring layout data and the design data, the distance between the guard rings can be determined. Thus, by previously storing a relationship between a potential difference and a distance as a condition for the above-mentioned destruction in the first storage unit 99 based on a simulation or a measurement, the potential difference between guard rings can be checked at the step S8.

Figure 11:
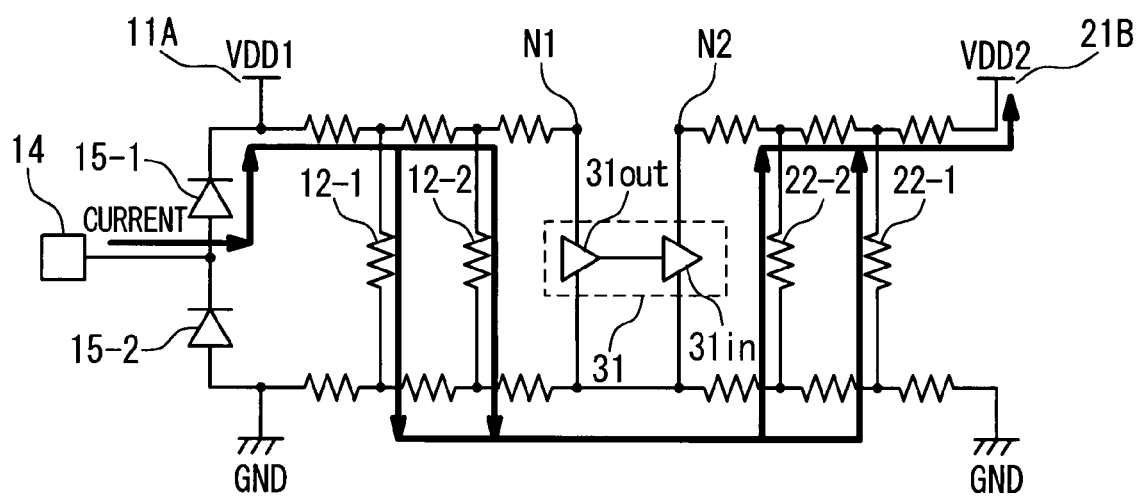
FIG. 11 is a schematic circuit diagram showing an example of a model in which a part of power supply protection elements are replaced with diodes.

FIG. 4 shows the model in which the current inlet and the current outlet are the pads for the power supply. However, even if at least one of the current inlet and the current outlet is a pad for the signal input/output or a pad for the ground (GND) other than the pad for the power supply, the ESD analysis can be carried out. FIG. 11 is a schematic circuit diagram showing an example of a model in which the current inlet is the pad for the signal input/output. A pad 14 for the signal input/output of the first power supply system of VDD1 is connected to one of an input buffer, an output buffer and an input/output buffer (these are not shown). A current inputted from the pad 14 passes through a diode 15-1 to the power supply wiring of the first power supply system of VDD1. Then, the current passes through routes as shown in FIG. 4, and is outputted from a pad 21B for the second power supply of VDD2. Even when the current inlet is the pad 14, except that the circuit simulation is performed in consideration of a circuit from the pad 14 to the power supply wiring (in this case, the protection diode 15-1) of the first power supply system of VDD1, this case is the same as the embodiment shown in FIGS. 4 to 10.

Even when the current outlet is a pad (not shown) for the signal or a pad for the GND of the second power supply system of VDD2, it is possible to perform the simulation respectively and obtain the potential differences between the border cells.

In FIG. 4, the modeling of the semiconductor device is executed to obtain the resistor network with resistance elements corresponding to protection elements as the model. On the other hand, in FIG. 11, the model is used in which a part of the power supply protection elements is replaced with diodes 15-1, 15-2. At this time, when the current flows as shown in FIG. 11, the circuit simulation can be carried out by ignoring the diode 15-2 to put into an open state or replacing it with a large resistance value. Similarly, as for the other elements, the circuit simulation can be carried out by replacing these other elements with resistance elements or diodes.

Figure 12:
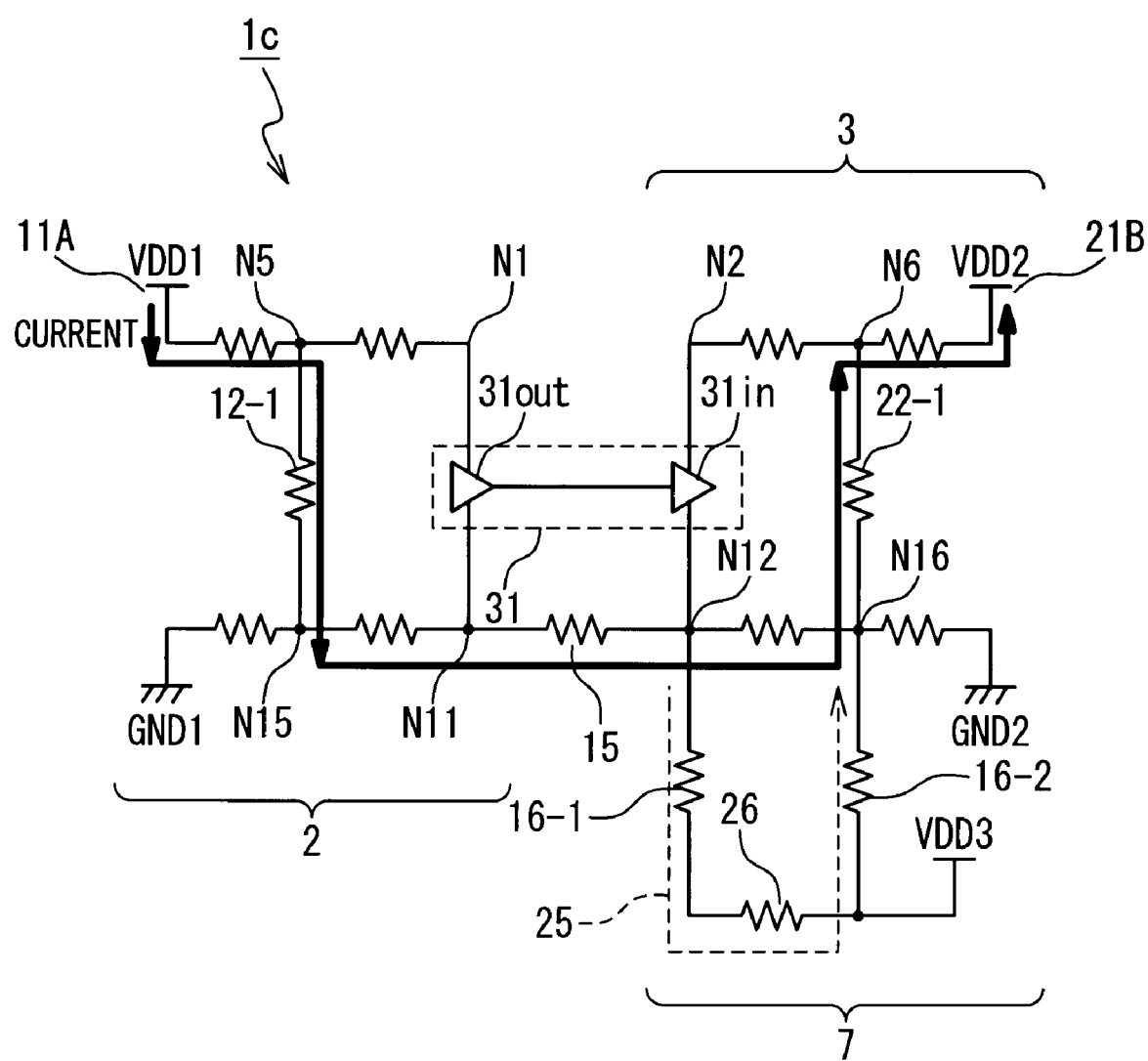
FIG. 12 is a schematic circuit diagram showing an example of a model including a power supply system which is not in a current path.

Furthermore, in FIG. 4, the simulation is performed by replacing the protection elements 12 (12-1, 12-2) placed between the pad 11A for the first the power supply (VDD1) as the current inlet and the common power source GND and the protection elements 22 (22-1, 22-2) placed between the pad 21B for the second power supply (VDD2) as the current outlet and the common power source GND with resistances. In a case where there are third and fourth power supply systems in addition to the first and second power systems (VDD1 and VDD2), the simulation can be carried out by using protection elements for the third and fourth power supply systems which are not in current paths with larger resistance value than the protection elements 12, 22 which are in the current paths. FIG. 12 is a schematic circuit diagram showing an example of a model including a power supply system which is not in a current path. A semiconductor device 1c further includes a third power supply system of VDD3 as another power supply system. At this time, for example, when an ESD current or voltage is applied between the pad 11A for the first power supply (VDD1) and the pad 21B for the second power supply (VDD2), the current does not substantially flows into a route through the third power supply system (VDD3). That is, the circuit region 7 for the third power supply system (VDD3) is not included in the current path. Thus, the simulation is carried out using a resistance of a route 25 represented as a dotted line in FIG. 12 as a large resistance value. For example, the resistance values of the resistance element 26 and the ESD protection elements 16-1, 16-2 are set to be large relative to other resistance elements.

According to the present invention, based on the layout design data (or the design data on the floor plan level), the modeling of the power supply wiring and the ESD protection elements is performed to obtain the resistor network as the model. Then, the potential distribution is outputted as the result of the circuit simulation executed using the resistor network. At this time, the ESD check can be performed by extracting the border cells from the resistor network, measuring the potential difference and comparing the measured potential difference with the reference value. That is, ESD verification becomes possible on the basis of the potential difference between border cells, which are directly related to gate breakdown. Therefore, the ESD check can be performed with very high accuracy. Thus, it is not necessary to set an excess margin for the ESD standards. Whereby, the ESD standards can be also relaxed.

Figure 13:
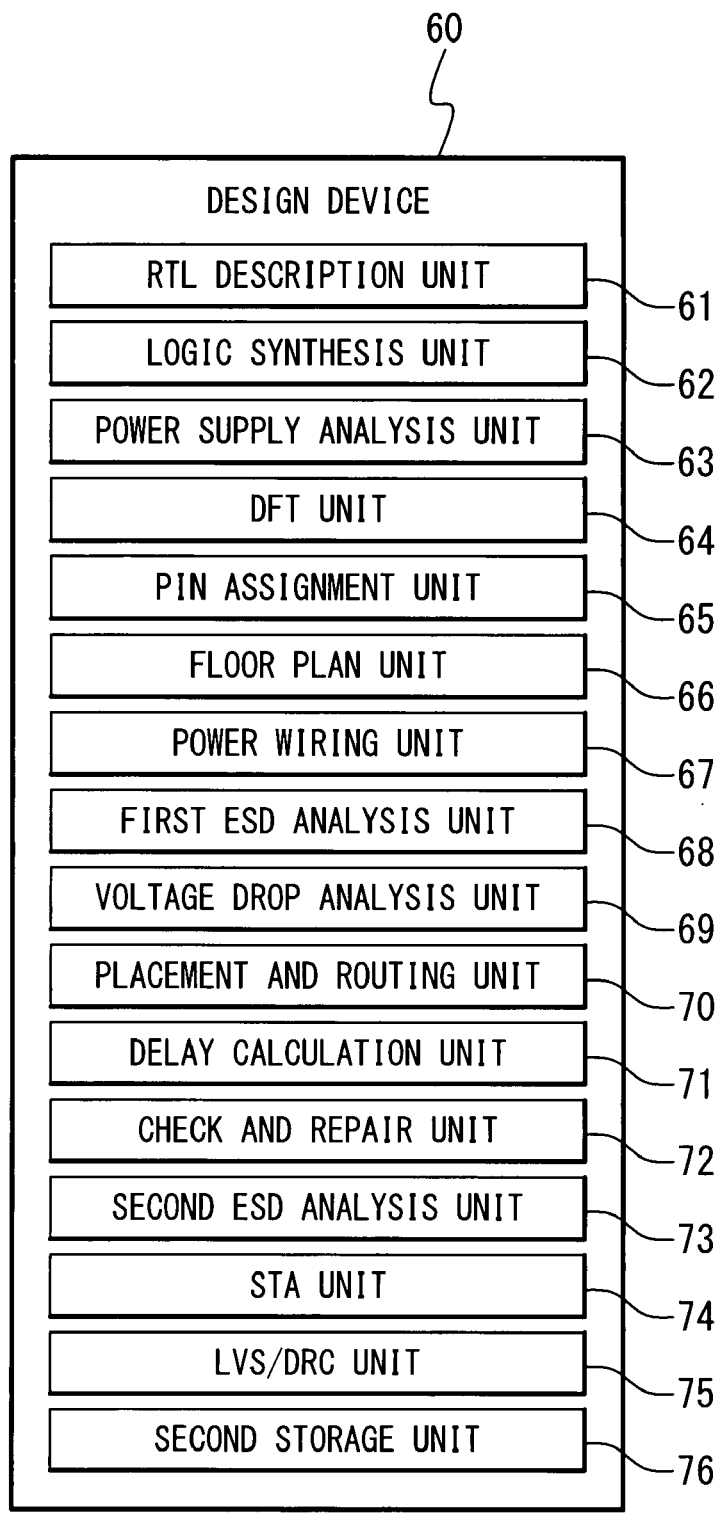
FIG. 13 is a block diagram showing a configuration of an embodiment of a design device of a semiconductor device according to the present invention.

Next, an embodiment of a design device of a semiconductor device (semiconductor integrated circuit) to which the ESD analysis program according to the present invention is applied will be described below. FIG. 13 is a block diagram showing a configuration of an embodiment of the design device of a semiconductor device according to the present invention. The design device 60 of the semiconductor device is an information processing device embodied by a personal computer, a work station or the like. The design device performs a series of processes of designing the semiconductor device (FIG. 2). Here, during the series of processes, the above-mentioned ESD analysis program according to the present invention is applied to at least one part. Whereby, the ESD check can be carried out with higher accuracy. In addition, design is made on the basis of the potential of the border cell itself, flexibility in design can be improved.

The design device 60 of the semiconductor device includes a RTL (Register Transfer Level) description unit 61, a logic synthesis unit 62, a power supply analysis unit 63, a DFT (Design for Testability) unit 64, a pin assignment unit 65, a floor plan unit 66, a power wiring unit 67, a first ESD analysis unit 68, a voltage drop analysis unit 69, a placement and routing unit 70, a delay calculation unit 71, a check and repair unit 72, a second ESD analysis unit 73, an STA (Static Timing Analysis) unit 74, and an LVS (Layout Versus Schematic)/DRC (Design Rule Check) unit 75 as computer programs, and a second storage unit 76 as data and a computer program. The RTL description unit 61, the logic synthesis unit 62, the power supply analysis unit 63, the DFT unit 64, the pin assignment unit 65, the floor plan unit 66, the power wiring unit 67, the first ESD analysis unit 68, the voltage drop analysis unit 69, the placement and routing unit 70, the delay calculation unit 71, the check and repair unit 72, the second ESD analysis unit 73, the STA unit 74 and the LVS/DRC unit 75 are stored in a memory (for example, an HDD) mounted in the information processing device, loaded in the main memory and operated by CPU. The second storage unit 76 is stored in the memory (for example, an HDD) mounted in the information processing device. The second storage unit 76 is accessed by the CPU or the like for a reading and writing operations at the time of operation of the RTL description unit 61, the logic synthesis unit 62, the power supply analysis unit 63, the DFT unit 64, the pin assignment unit 65, the floor plan unit 66, the power wiring unit 67, the first ESD analysis unit 68, the voltage drop analysis unit 69, the placement and routing unit 70, the delay calculation unit 71, the check and repair unit 72, the second ESD analysis unit 73, the STA unit 74 and the LVS/DRC unit 75.

The RTL description unit 61 performs an RTL (Register Transfer level) circuit design and generates a RTL description file, based on specification data. The RTL description file can be generated using HDL (Hardware Description Language) such as the Verilog and the VHDL.

The logic synthesis unit 62 performs logic synthesis and generates a net list, based on the RTL description file and a library. The net list is data having information of circuits (including a plurality of circuit regions driven by different power supply systems) and information on connections between the circuits.

The power supply analysis unit 63 analyzes whether or not predetermined power is appropriately supplied to each circuit region for each of a plurality of power supply systems, based on the net list.

The DFT (Design-for-Testability) unit 64 automatically generates a test pattern for a semiconductor device under designing by the design-for-testability.

The pin assignment unit 65 determines positions of pads and positions of the pads for the power supply, the pads for the GND and an ESD protection circuits in the I/O region and adds them to a floor plan based on the net list.

The floor plan unit 66 performs schematic cell placement so as to fit circuits in a semiconductor chip by the floor plan process and generates the floor plan, based on the net list and the library.

The power wiring unit 67 executes routing of wirings of the power supply system and GND in the I/O region and the core region, based on the floor plan, the net list and the library. Whereby, the power wiring unit 67 generates power supply wiring layout data (first design data) as layout data including wirings of power sources and GND connected to the pads for the power supply, the pads for the GND, the ESD protection circuits and each cell.

The first ESD analysis unit 68 performs operations similar to that of the ESD analysis device 90, based on the generated power supply wiring layout data (first design data). Here, since the border cells are not placed in this step, a potential difference between the border cell 31out and the border cell 31in in a case where the border cells are placed at the respective positions is predicted by the ESD analysis, and thereby, layout positions of the border cell in which the potential difference does not exceed an upper limit of predetermined potential difference reference is stored in the second storage unit 76 as border cell layout position restriction data. As a result of the ESD analysis, in a case where the potential difference exceeds the upper limit of predetermined potential difference reference even if the border cell is placed at any position, or the replacement position is greatly restricted, it is determined that a problem occurs and various repair is carried out.

The voltage drop analysis unit 69 generates RC information including information concerning resistance and parasitic capacitance of wirings by the RC extraction processing, based on the power supply wiring layout data (first design data), the floor plan, the net list and the library.

The placement and routing unit 70 performs a replacement process of cells and a routing process of wirings and generates layout data (second design data), based on the power supply wiring layout data, the floor plan, the net list, the library, and the border cell layout position restriction data created by the first ESD analysis unit 68. In particular, the placement and routing are executed for the border cells on the basis of the border cell layout position restriction data so as not to cause ESD destruction.

The delay calculation unit 71 performs a delay calculation based on the layout data (second design data), the RC information and a cell delay library for verification in the library.

The check and repair unit 72 performs check repair process based on the delay calculation result and the layout data (second design data).

The second ESD analysis unit 73 performs an operation similar to that of the ESD analysis device 90 based on the layout data (second design data) after the check and repair process. As a result of the ESD analysis, if a problem is found, various repairs are carried out.

The STA (Static Timing Analysis) unit 74 performs a static timing analysis based on the layout data (second design data) after the ESD analysis.

The LVS (Layout Versus Schematic)/DRC (Design Rule Check) unit 75 performs a consistency verification (layout verification) between the layout and a circuit diagram, and a verification of a design rule, based on the layout data (second design data), the circuit diagram data and a design rule file.

Figure 14:
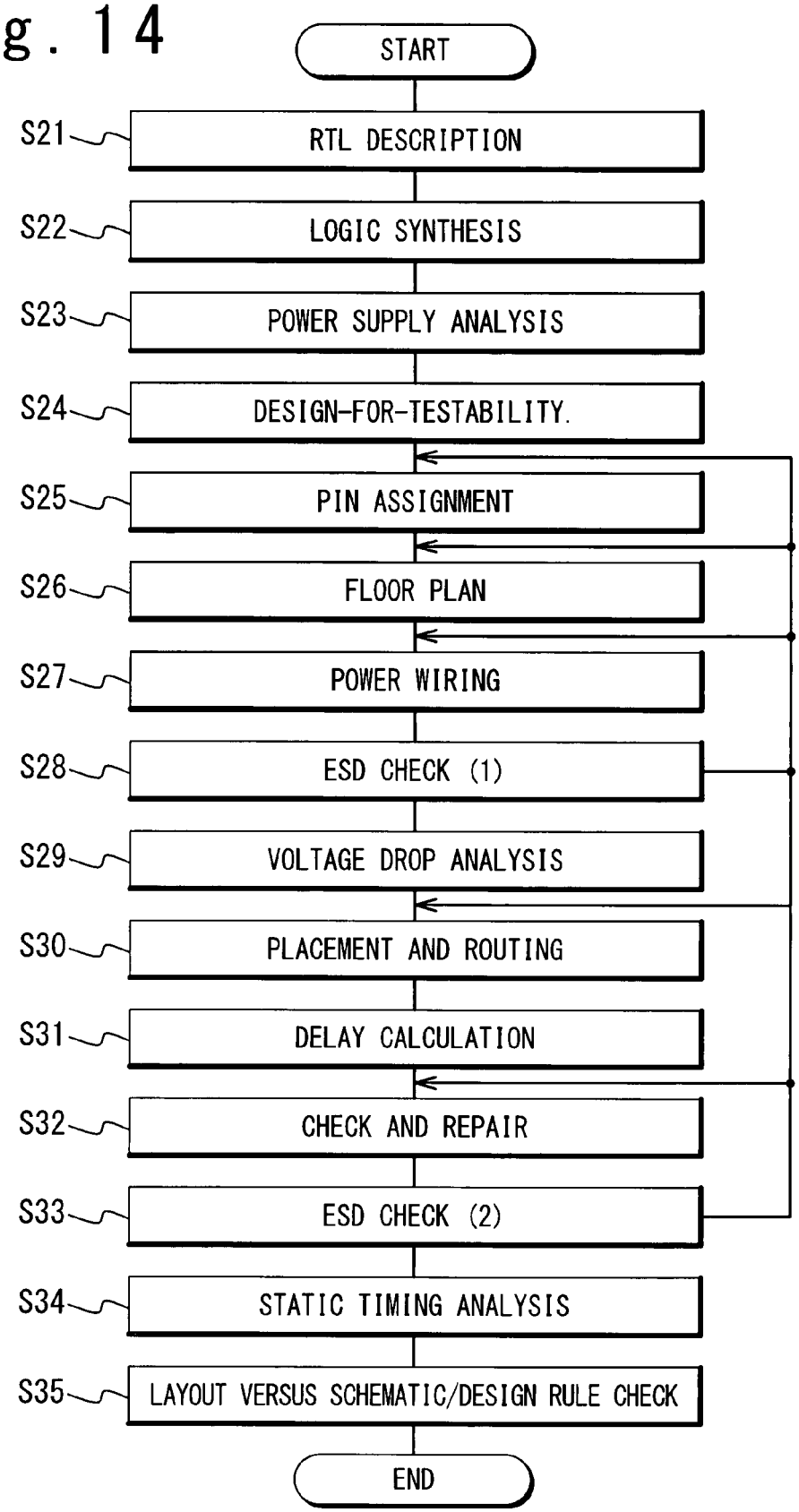
FIG. 14 is a flow chart showing an embodiment of a method of designing a semiconductor device according to the present invention.

Next, referring to FIGS. 13 and 14, an embodiment of a method of designing the semiconductor device according to the present invention will be described below. FIG. 14 is a flow chart showing an embodiment of the method of designing the semiconductor device according to the present invention. The method of designing the semiconductor device is considered to be roughly categorized into a logic synthesis process and an automatic layout process. The logic synthesis process corresponds to the steps S21 to S22 and the automatic layout process corresponds to the steps S23 to S35.

(1) Step S21

The RTL description unit 61 executes a RTL circuit design and generates the RTL description file, based on specification data.

(2) Step S22

The logic synthesis unit 62 performs logic synthesis process and generates the net list, based on the RTL description file and the library.

(3) Step S23

The power supply analysis unit 63 analyzes whether or not predetermined powers are appropriately supplied to the respective circuit regions for a plurality of power supply systems, based on the net list.

(4) Step S24

The DFT unit 64 automatically generates the test pattern for the semiconductor device under design by the design-for-testability.

(5) Step S25

The pin assignment unit 65 determines positions of pads and positions of the pads for the power supply, the pads for the GND and the ESD protection circuits in the I/O region and adds them to the floor plan, based on the net list.

(6) Step S26

The floor plan unit 66 performs the schematic cell placement so as to fit the circuits in the semiconductor chip by the floor plan process and generates the floor plan, based on the net list and the library.

(7) Step S27

The power wiring unit 67 executes the routing of wirings of the power sources and the GND in the I/O region and the core region, based on the floor plan, the net list and the library. Whereby, the power wiring unit 67 generates the power supply wiring layout data (first design data) as the layout data including wirings of the power sources and the GND connected to the pads for the power supply, the pads for the GND, the ESD protection circuits and each cell.

(8) Step S28

The first ESD analysis unit 68 performs the operation similar to that of the ESD analysis device 90 (steps S2 to S10), based on the generated power supply wiring layout data (first design data). Here, a value of a resistivity is previously stored in the second storage unit 76. Since the border cells are not placed in this step, a potential difference between the border cell 31out and the border cell 31in in the case where the border cells are placed at the respective positions is predicted by the ESD analysis, and thereby, layout positions of the border cell in which the potential difference does not exceed the upper limit of the predetermined potential difference reference is stored in the second storage unit 76 as the border cell layout position restriction data. The border cell layout position restriction data is used at a below-mentioned step 30 of performing the replacement and routing process. As a result of the ESD analysis, in a case where the potential difference exceeds the upper limit of predetermined potential difference reference even if the border cell is placed at any position, or the placement position is greatly restricted, it is determined that a problem occurs and various repair is carried out. For example, based on an extent that the potential difference exceeds the upper limit of predetermined potential difference reference, the design process returns to one of the steps S27, S26, and S25. Here, as the extent is larger, the design process returns to an earlier step. In this case, a restriction is provided so as not to have the same power supply wiring (if the process goes back to S27), the same floor plan (if the process goes back to S26), the same pin assignment (if the process goes back to S25) having a problem.

(9) Step S29

The voltage drop analysis unit 69 generates the RC information including information concerning resistance and parasitic capacitance of wirings by the RC extraction process, based on the power supply wiring layout data (first design data) having no problem found by the ESD analysis, the floor plan, the net list and the library.

(10) Step S30

The placement and routing unit 70 performs the placement process of cells and the routing process of wirings and generates the layout data (second design data), based on the power supply wiring layout data, the floor plan, the net list, the library and the border cell layout position restriction data created at the step 28. In particular, the placement and routing are executed for the border cells on the basis of the border cell layout position restriction data so as not to cause the ESD destruction.

(11) Step S31

The delay calculation unit 71 performs the delay calculation, based on the layout data (second design data), the RC information and the cell delay library for verification in the library.

(12) Step S32

The check and repair unit 72 performs the check repair process, based on the delay calculation result and the layout data (second design data).

(13) Step S33

The second ESD analysis unit 73 performs the operation similar to that of the ESD analysis device 90 (steps S2 to S10), based on the layout data (second design data) after the check and repair process. Here, the value of the resistivity is previously stored in the second storage unit 76. Since the placement and routing are executed at the step S30 on the basis of the border cell layout position restriction data generated at the step S28, as a general rule, no problem occurs in the ESD analysis in this step. However, as a result of the ESD analysis, if any problem occurs, various repairs are carried out. For example, as a result of the ESD analysis, in the case where the potential difference between the border cell 31out and the border cell 31in exceeds the upper limit of predetermined potential difference reference, it is determined that a problem occurs and various repair is carried out. For example, based on the extent that the potential difference exceeds the upper limit of predetermined potential difference reference, the design process returns to one of the steps S32, S30, S27, S26, S25. Here, as the extent is larger, the design process returns to an earlier step. In this case, a restriction is provided so as not to have the same repair (if the process goes back to S32), the same layout wiring (if the process goes back to S30), the same power supply wiring (if the process goes back to S27), the same floor plan (if the process goes back to S26), the same pin assignment (if the process goes back to S25) having a problem.

(14) Step S34

The STA unit 74 performs a static timing analysis, based on the layout data (second design data) after the ESD analysis.

(15) Step S35

The LVS/DRC unit 75 performs consistency verification (layout verification) between the layout and the circuit diagram, and a verification of the design rule Based on the layout data (second design data), circuit diagram data and the design rule file. Whereby, the layout data is completed.

In this manner, the semiconductor device can be designed.

According to the present invention, the ESD check can be carried out by extracting the border cell from the resistor network with resistances as the ESD protection elements, measuring the potential difference and comparing the measured potential difference with the reference value. Here, the resistor network is obtained by the semiconductor device modeling. That is, the ESD verification with high accuracy can be carried out based on the potential difference directly relating to the gate breakdown. Consequently, it is possible to relax ESD standards and thus, improve flexibility in design of the semiconductor device.

The following other methods are available for repairs at the steps S28, S33.

(1) Method of Moving the Border Cell (at Least Either of the Border Cell 31out or the Border Cell 31in) Having a Problem to a Position at which No Problem in the Resistor Network Occurs A potential difference between nodes in a vicinity of the border of the circuit regions for the different power supply systems becomes smaller than a potential difference between nodes away from the border. Therefore, the problem can be avoided by moving the border cell having a problem from an original position to a vicinity position in the vicinity of the border. Here, the border is closer to the vicinity position than the original position. The vicinity position where the border cell moves can be set such that the potential difference of the border cell meets the predetermined potential difference reference, based on the potential at each node in the resistor network and other restriction conditions (placement restriction) obtained in the circuit simulation at the step S6.

(2) Method of Providing a Protection Element in Front of or in the Vicinity of the Border Cell (at Least Either of the Border Cell 31out or the Border Cell 31in) Having a Problem The ESD current can be released or made small so as not to cause any problem by providing a protective local clamp in front of the border cell to which an ESD current enters. Such local clamp is embodied by, for example, gate protection elements 411, 412 (clamp elements) disclosed in Japanese Laid-Open Patent Application JP-P 2004-282058 A (corresponding to US2006103421 A1). In this case, the gate protection element is embodied by a MOS transistor. In the MOS transistor, a source and a gate are connected to a common power supply wiring (GND wiring), and a drain is connected to (a gate of) a border cell.

(3) Method of Lowering Wiring Resistance of a Power Supply Wiring and a Common Power Supply Wiring of the Border Cell (at Least Either of the Border Cell 31out or the Border Cell 31in) Having a Problem A potential gradient occurring in the ESD current can be relaxed by lowering wiring resistance of the power supply wiring and the common power supply wiring, thereby lowering the potential difference of the border cell. For example, by making the power supply wiring thick, the wiring resistance can be lowered.

(4) Method of Enhancing Protection Elements Between Power Sources

The design can be changed so as to meet the potential difference reference between the power sources by increasing the size or number of protection elements between the power sources to allow the current to diverge and reduce an effective resistance, thereby relaxing the potential difference between the power sources. As a rule, the protection element between the power sources may be added at any position. However, it is especially effective to add the protection element between the power sources in the vicinity of the border cell having a problem.

The above-mentioned embodiment is described using a SoC (System on Chip) in which a plurality of circuits receiving electric power from different power supply systems are formed in one chip as an example. However, similarly, the embodiment can be also applied to SIP (System in Package described later) in which a plurality of chips are implemented in one package.

Figure 15:
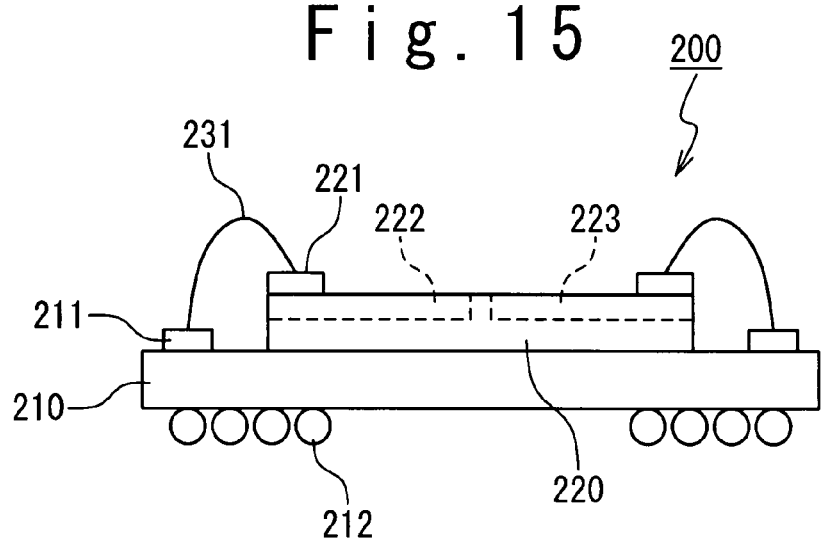
FIG. 15 is a schematic side view showing an example of a configuration of the SoC to which the present invention is applied.

FIG. 15 is a schematic side view showing an example of a configuration of the SoC to which the present invention is applied. A chip 220 is implemented on an assembling substrate 210. A bonding pad 221 formed on the chip 220 is connected to a bonding pad 211 formed on the assembling substrate 210 with bonding wires 231. The chip 220 is the SoC and has circuit regions 2, 3 for a plurality of power supply systems. A plurality of balls 212 for connections to the outside is disposed on a lower surface of the assembling substrate 210. An internal wiring connecting between the bonding pad 211 and the balls 212 is formed in the assembling substrate 210.

Figure 16:
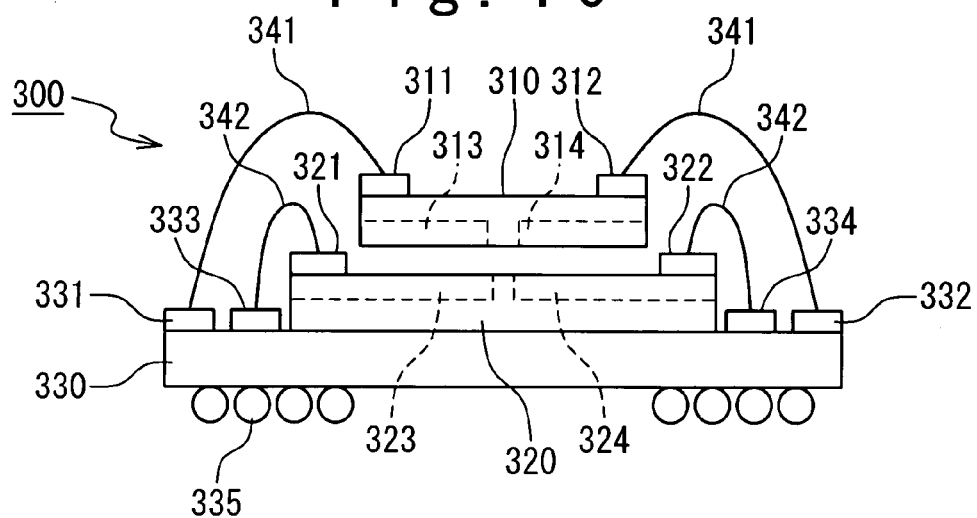
FIG. 16 is a schematic side view showing an example of a configuration of the SIP to which the present invention is applied.

Next, an example of configuration of a SIP will be described. Hereinafter, a chip-on-chip structure in which a plurality of chips is laminated on an assembling substrate is described as an example. However, the present invention can be also applied to the SIP in which the plurality of chips is disposed on an assembling substrate in a planate manner. FIG. 16 is a schematic side view showing an example of a configuration of the SIP to which the present invention is applied. A SIP 300 includes a first chip 310, a second chip 320 and an assembling substrate 330. The second chip 320 is implemented on the assembling substrate 330. Furthermore, the first chip 310 is stacked and implemented on the second chip 320. A surface on which circuits are formed of the first chip 310 and a surface on which circuits are formed of the second chip 320 are provided on the same side (on an opposite side to a side of the assembling substrate).

The first chip 310 has bonding pads 311, 312 thereon. The bonding pads 311, 312 are connected to bonding pads 331, 332 on the assembling substrate 330 with bonding wires 341. The first chip 310 includes a circuit region 313 and a circuit region 314. The circuit regions 313, 314 are connected to the assembling substrate 330 via the bonding pads 311, 312.

The second chip 320 has bonding pads 321, 322 thereon. The bonding pads 321, 322 are connected to bonding pads 333, 334 on the assembling substrate 330 with bonding wires 342. The second chip 320 includes a circuit region 323 and a circuit region 324. The circuit regions 323, 324 are connected to the assembling substrate 330 via the bonding pads 321, 322.

The first chip 310 and the second chip 320 are individually connected to the assembling substrate 330. The first chip 310 is connected to the second chip 320 via internal wirings of the assembling substrate 330. A plurality of balls 335 are disposed on a lower surface of the assembling substrate 330 and used for a connection to an outer circuit.

Figure 17:
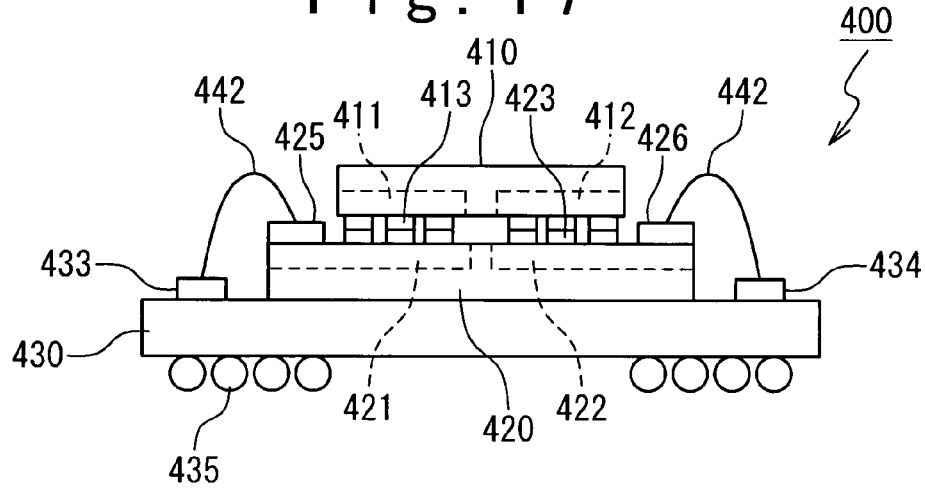
FIG. 17 is a schematic side view showing another example of a configuration of the SoC to which the present invention is applied.

FIG. 17 is a schematic side view showing another example of a configuration of the SIP to which the present invention is applied. An SIP 400 includes a first chip 410, a second chip 420 and an assembling substrate 430. The second chip 420 is implemented on the assembling substrate 430. The first chip 410 is stacked and implemented on the second chip 420. The first chip 410 and the second chip 420 are integrated so that surfaces thereof on which circuits are formed are opposed to each other.

The first chip 410 includes circuit regions 411, 412 on a side opposed to the second chip 420. The first chip 410 further has connection pads 413 on the surface opposed to the second chip 420. Similarly, the second chip 420 includes circuit regions 421, 422 on a side opposed to the first chip 410. The second chip 420 further has connection pads 423 on the surface opposed to the first chip 410. A circuit of the first chip 410 is connected to a circuit of the second chip 420 via the connection pads 413, 423.

The second chip 420 has bonding pads 425, 426 on a surface thereof. The second chip 420 is connected to bonding pads 433, 434 on the assembling substrate 430 with bonding wires 442. A circuit region 421 and a circuit region 422 are connected to the assembling substrate 430 via the bonding pads 433, 434. A plurality of balls 435 is disposed on a lower surface of the assembling substrate 430 and used for a connection to an outer circuit. The bonding pads 433, 434 and the balls 435 are connected to each other via internal wirings formed in the assembling substrate 430.

In an example shown in FIG. 17, the first chip 410 is not directly connected to the assembling substrate 430, but connected to the assembling substrate 430 via the second chip 420. In addition, the first chip 410 may have a bonding pad and have a circuit structure to supply power sources and GND from the assembling substrate 430.

The above-mentioned embodiment can be applied to each SIP described above. For example, the circuit regions belonging to different power supply systems described in the embodiment can be formed in respective chips. Input/output of a signal in the first power supply system and the second power supply system is performed via an interconnect wirings between chips. The interconnect wirings between chips, as described above, are formed of, for example, wirings in assembling substrate or the connection pad directly connecting chips to each other.

Here, effects of the ESD current in the embodiment will be described using an example of SIP. It is assumed that the circuit region for the first power supply system in FIGS. 2 to 4, (FIG. 5, FIG. 6, FIG. 12) is formed in the first chip in FIG. 16, (FIG. 17) and the circuit region for the second power supply system in FIGS. 2 to 4, (FIG. 5, FIG. 6, and FIG. 12) is formed in the second chip in FIG. 16, (FIG. 17). The border cells in FIGS. 2 to 4, (FIG. 5, FIG. 6, and FIG. 12) are cells for inputting/outputting a signal between the circuit regions for the first power supply system and the second power supply system. Information of each chip can be obtained from (power supply wiring) layout data of each chip.

Figure 18:
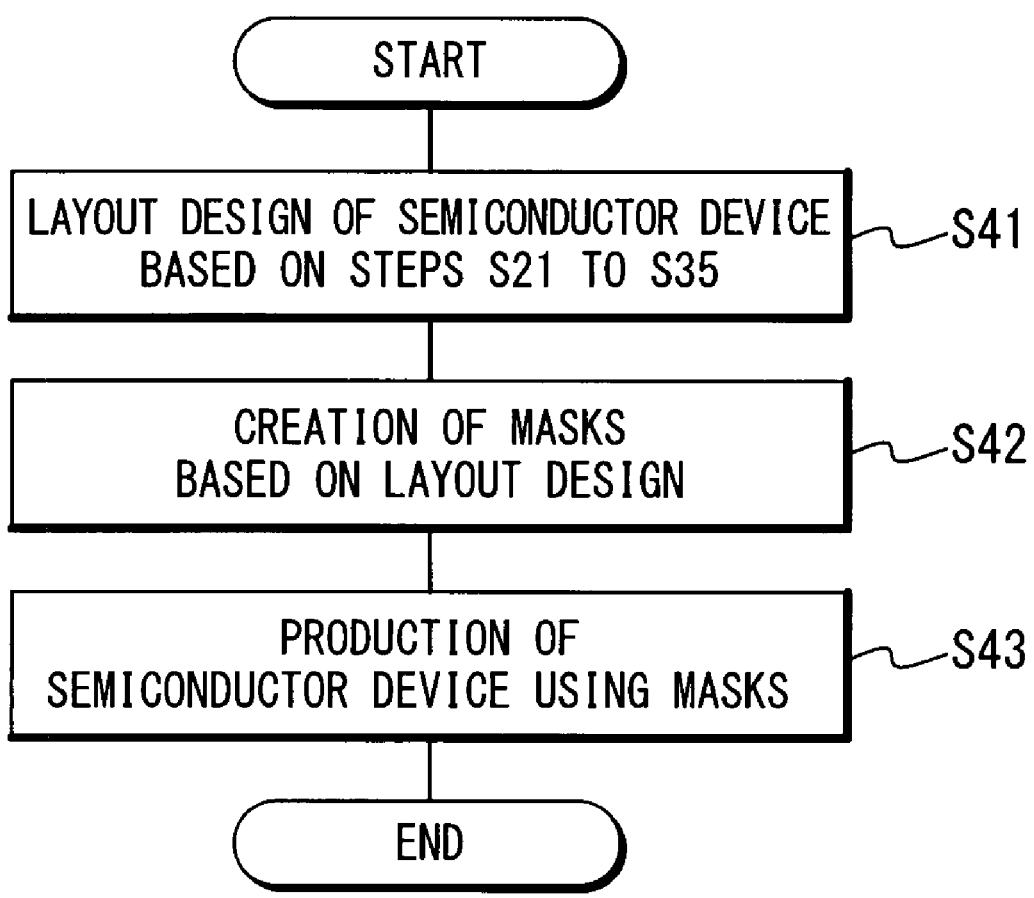
FIG. 18 is a flow chart showing an embodiment of the method of producing the semiconductor device according to the present invention.

A method of producing semiconductor device according to the present invention using layout data of the semiconductor device produced by the method of designing the semiconductor device will be described below. FIG. 18 is a flow chart showing an embodiment of the method of producing the semiconductor device according to the present invention.

(1) Step S41

Layout data is obtained by performing the steps S21 to S35 described above. That is, by design processing of the semiconductor device, a layout design of the semiconductor device is completed and the layout data is acquired.

(2) Step S42

Based on the layout data acquired at the step S41, masks used in a semiconductor production process is designed. Based on the design, the mask is created. Methods of designing and creating the mask are not specifically limited and conventionally known methods can be used.

(3) Step S43

Using the mask created at the step S42, the semiconductor device is produced on a semiconductor substrate. As long as the mask is used, a semiconductor device production process is not specifically limited. For example, conventionally known methods such as film formation processing, ion implantation process and photolithography process can be adopted.

By performing the steps S41 to S43, the semiconductor device according to the present invention can be produced. Also in this case, since the ESD analysis according to the present invention is carried out, ESD verification with high accuracy becomes possible. Consequently, it is possible to relax ESD standards and thus, improve flexibility in design of the semiconductor device.

According to the present invention, in designing the semiconductor device, the border cell which may cause gate breakdown can be found comprehensively. According to conventional methods, a shortest path between two pads is searched. For this reason, only the point relating to the shortest path can be checked. On the other hand, according to the present invention, by performing the simulation, the potential difference (and potential distribution) can be obtained at even points other than the shortest path. Consequently, it becomes possible to comprehensively find the border cell which may cause the gate breakdown.

According to the present invention, a reliability of ESD check can be improved. Whether or not the gate breakdown occurs due to the ESD depends on the potential difference between the border cells which transfer signals between different power sources. Therefore, as compared to the conventional technique of measuring the potential difference between pads, the ESD check can be performed with higher reliability by measuring the potential difference between the border cells.

Flexibility in design of a LSI can be improved than that of conventional technique. Even when the potential difference between pads exceeds the reference value, depending on a layout of the border cells, voltage applied to a gate of the border cells may be the reference value or less and have no problem. According to the present invention, since a potential difference between the border cells which actually transfer signals is measured, it is possible to relax ESD standards and thus, improve the flexibility in design.

The present invention is not limited to the above-mentioned embodiments and it is apparent that each embodiment may be modified or changed within technical concepts of the present invention as necessary.

For example, although the circuit simulation unit 96 applies a constant current from the current inlet and draws the current from the current outlet at the step S6 in FIG. 7, a constant voltage may be applied between the current inlet and the current outlet.

In designing the semiconductor device having a plurality of power supply systems, ESD analysis can be performed more accurately, thereby achieving ESD check with high reliability. Moreover, in designing the semiconductor device having a plurality of power supply systems, it is possible to relax ESD standards and improve flexibility in design of the semiconductor device.

It is apparent that the present invention is not limited to the above embodiment, but may be modified and changed without departing from the scope and spirit of the invention.

What is claimed is:

1. An ESD (Electrostatic Discharge) analysis device comprising:
   a circuit simulation unit configured to execute a circuit simulation of design data of a semiconductor integrated circuit including a plurality of circuits of a plurality of power supply systems, to calculate potentials in a plurality of current paths between pads of different two of said plurality of power supply systems, when one of an ESD current and an ESD voltage is applied between said pads;
   a border cell extraction unit configured to extract border cells from circuits of said different two of the plurality of power supply systems, wherein said circuits are included in said plurality of circuits, said border cells input and/or output signals between said circuits; and
   a check unit configured to check an ESD tolerance by calculating a potential difference between said border cells, based on said calculated potentials, said extracted border cells.

2. The ESD analysis device according to claim 1, wherein said check unit calculates said potential difference for each pair of said border cells.

3. The ESD analysis device according to claim 1, wherein said circuit simulation unit executes said circuit simulation of each pair of said pads of said different two of said plurality of power supply systems, and
   said check unit checks said ESD tolerance by comparing a maximum value of said potential difference with a reference value in said each pair of said pads.

4. The ESD analysis device according to claim 1, wherein said circuit simulation unit executes said circuit simulation of each pair in said plurality of power supply systems, and
   said check unit checks said ESD tolerance of said each pair in said plurality of power supply systems.

5. The ESD analysis device according to claim 1, further comprising:
   a circuit element extraction unit configured to extract circuit elements of wiring resistances and power protection elements placed between said pads and between one of said pads and one of said border cells based on said design data,
   wherein said circuit simulation unit executes said circuit simulation based on said extracted circuit elements.

6. The ESD analysis device according to claim 5, wherein said circuit element extraction unit extracts said circuit elements by assuming said wiring resistances and power protection elements to be resistors.

7. The ESD analysis device according to claim 6, wherein said circuit element extraction unit converts said power protection elements to said resistors based on previously calculated resistivity of said power protection elements and a size of said power protection elements.

8. The ESD analysis device according to claim 1, wherein said border cell extraction unit searches said border cells by an equipotential trace on a power supply wiring between each of cells and a power source in said semiconductor integrated circuit, and said equipotential trace on input/output signals between said cells.

9. A computer program product for ESD (Electrostatic Discharge) analysis, embodied on a non-transitory computer-readable medium and comprising code that, when executed, causes a computer to perform the following:
   specifying a first pad and a second pad in a design data of a semiconductor integrated circuit which includes:
      a first circuit connected to a first power supply wiring and a first common power supply wiring,
      a second circuit connected to a second power supply wiring and a second common power supply wiring, and inputting and outputting signals to and from said first circuit,
      said first pad connected to said first power supply wiring,
      said second pad connected to said second power supply wiring,
      a first power protection element placed between said first pad and said first common power supply wiring, and
      a second power protection element placed between said second pad and said second common power supply wiring;
   executing a circuit simulation of said design data to calculate potentials in a resistor network which indicates a plurality of current paths between said first pad and said second pad, based on said network and one of an ESD current and an ESD voltage applied between said first pad and said second pad;
   extracting a first border cell from said first circuit and a second border cell from said second circuit, wherein said first border cell inputs and outputs signals to and from said second border cell;
   calculating a potential difference between a potential at a connection portion of said first power supply wiring with said first border cell and a potential at a connection point of said second power supply wiring with said second border cell, based on said calculated potentials, said extracted first and second border cells; and
   checking an ESD tolerance based on said calculated potential difference.

10. The computer program product according to claim 9, wherein said specifying step to said calculating step are performed for each pair of said first border cell and said second border cell.

11. The computer program product according to claim 9, wherein said executing step includes: replacing said first and second power protection elements with resistors in advance.

12. The computer program product according to claim 11, wherein said design data of the semiconductor integrated circuit further includes:
   a third pad connected to a third power supply wiring, and
   a third power protection element placed between said third power supply wiring and one of said first and second common power supply wirings, and
   wherein said executing step includes:
   replacing said third power protection element with a resistor of which resistance value is higher than that of each of said first and second power protection element in advance.

13. The computer program product according to claim 11, wherein said replacing step includes:
   converting said first and second power protection elements to said resistors based on previously calculated resistivity of said first and second power protection elements and a size of said first and second power protection elements.

14. A method of designing a semiconductor device, comprising:
   carrying out a logic synthesis process and an automatic layout process to generate a design data of a semiconductor integrated circuit which includes:
      a first circuit connected to a first power supply wiring and a first common power supply wiring,
      a second circuit connected to a second power supply wiring and a second common power supply wiring, and inputting and outputting signals to and from said first circuit,
      a first pad connected to said first power supply wiring,
      a second pad connected to said second power supply wiring,
      a first power protection element placed between said first pad and said first common power supply wiring, and
      a second power protection element placed between said second pad and said second common power supply wiring;
   specifying said first pad and said second pad in said design data of the semiconductor integrated circuit;
   executing a circuit simulation of said design data to calculate potentials in a resistor network which indicates a plurality of current paths between said first pad and said second pad, based on said network and one of an ESD current and an ESD voltage applied between said first pad and said second pad;
   extracting a first border cell from said first circuit and a second border cell from said second circuit, wherein said first border cell inputs and outputs signals to and from said second border cell;
   calculating a potential difference between a potential at a connection portion of said first power supply wiring with said first border cell and a potential at a connection point of said second power supply wiring with said second border cell, based on said calculated potentials, said extracted first and second border cells; and
   checking, by a computer, an ESD tolerance based on said calculated potential difference.

15. The method of designing a semiconductor device, according to claim 14, wherein said specifying step to said calculating step are performed for each of all pairs of said first border cell and said second border cell.

16. The method of designing a semiconductor device, according to claim 14, wherein said executing step includes:
   replacing said first and second power protection elements with resistors in advance.

17. The method of designing a semiconductor device, according to claim 16, wherein said design data of the semiconductor integrated circuit further includes:
   a third pad connected to a third power supply wiring, and
   a third power protection element placed between said third power supply wiring and one of said first and second common power supply wirings, and
   wherein said executing step includes:
   replacing said third power protection element with a resistor of which resistance value is higher than that of each of said first and second power protection element in advance.

18. The method of designing a semiconductor device, according to claim 16, wherein said replacing step includes:
   converting said first and second power protection elements to said resistors based on previously calculated resistivity of said first and second power protection elements and a size of said first and second power protection elements.

19. The method of designing a semiconductor device, according to claim 16, wherein said carrying out step includes:
   performing said specifying step to said checking step based on a design data after routing of power wirings which is generated after routing of power wirings in said automatic layout process.

20. The method of designing a semiconductor device, according to claim 19, wherein said carrying out step includes:
   predicting a potential difference between said first border cell and said second border cell in a case where said first and second border cells are placed at respective positions of said first and second circuits by the ESD analysis,
   storing positions of said first and second border cells in which said potential difference does not exceed an upper limit of a predetermined potential difference reference as a border cell layout position restriction data, and
   placing said first and second border cells based on said border cell layout position restriction data.

* * * * *